US011791338B2

(12) United States Patent
Huang et al.

(10) Patent No.: US 11,791,338 B2
(45) Date of Patent: Oct. 17, 2023

(54) SEMICONDUCTOR DEVICE HAVING DOPED WORK FUNCTION METAL LAYER

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chih-Hsiung Huang, Kaohsiung (TW); Chung-En Tsai, Hsinchu County (TW); Chee-Wee Liu, Taipei (TW); Kun-Wa Kuok, Hsinchu (TW); Yi-Hsiu Hsiao, Hsinchu (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 17/585,020

(22) Filed: Jan. 26, 2022

(65) Prior Publication Data
US 2022/0149041 A1    May 12, 2022

Related U.S. Application Data

(62) Division of application No. 16/548,730, filed on Aug. 22, 2019, now Pat. No. 11,244,945.

(51) Int. Cl.
*H01L 29/49* (2006.01)
*H01L 27/092* (2006.01)
(Continued)

(52) U.S. Cl.
CPC ...... *H01L 27/092* (2013.01); *H01L 21/28088* (2013.01); *H01L 21/823821* (2013.01);
(Continued)

(58) Field of Classification Search
CPC .......... H01L 27/092; H01L 21/823842; H01L 29/401; H01L 29/66545; H01L 21/823821;
(Continued)

(56) References Cited

U.S. PATENT DOCUMENTS

2012/0223387 A1* 9/2012 Cui .................. H01L 29/66356
257/366
2013/0049141 A1* 2/2013 Cheng ............... H01L 29/66045
257/412
(Continued)

OTHER PUBLICATIONS

A. Veloso et al., "Gate-Last vs. Gate-First Technology for aggressively scaled EOT Logic/RF CMOS", Symposium on VLSI Technology Digest of Technical Papers, 2011, pp. 34-35.
(Continued)

*Primary Examiner* — Shahed Ahmed
(74) *Attorney, Agent, or Firm* — Maschoff Brennan

(57) ABSTRACT

A semiconductor device includes a substrate, a gate stack, and epitaxy structures. The substrate has a P-type region. The gate stack is over the P-type region of the substrate and includes a gate dielectric layer, a bottom work function (WF) metal layer, a top WF metal layer, and a filling metal. The bottom WF metal layer is over the gate dielectric layer. The top WF metal layer is over and in contact with the bottom WF metal layer. Dipoles are formed between the top WF metal layer and the bottom WF metal layer, and the dipoles direct from the bottom WF metal layer to the top WF metal layer. The filling metal is over the top WF metal layer. The epitaxy structures are over the P-type region of the substrate and on opposite sides of the gate stack.

20 Claims, 25 Drawing Sheets

(51) Int. Cl.
*H01L 29/66* (2006.01)
*H01L 21/28* (2006.01)
*H01L 21/8238* (2006.01)
*H01L 29/40* (2006.01)

(52) U.S. Cl.
CPC .. *H01L 21/823842* (2013.01); *H01L 27/0924* (2013.01); *H01L 29/401* (2013.01); *H01L 29/4966* (2013.01); *H01L 29/66545* (2013.01)

(58) Field of Classification Search
CPC ..... H01L 27/0924; H01L 29/495–4958; H01L 29/4966–4975; H01L 21/28079–28088; H01L 21/32051–32053; H01L 29/66606; H01L 29/66871; H01L 29/7848; H01L 29/165; H01L 29/7843; H01L 21/823418–823425
See application file for complete search history.

(56) References Cited

U.S. PATENT DOCUMENTS

| | | | | |
|---|---|---|---|---|
| 2013/0241004 A1* | 9/2013 | Yin | ..................... | H01L 29/4966 257/392 |
| 2015/0076623 A1* | 3/2015 | Tzou | ................... | H01L 29/4966 257/407 |
| 2017/0250279 A1* | 8/2017 | Wei | ........................ | H01L 29/785 |
| 2017/0365608 A1* | 12/2017 | Lee | ..................... | H01L 29/4236 |
| 2019/0371912 A1* | 12/2019 | Bao | ................. | H01L 21/823431 |

OTHER PUBLICATIONS

Ruqiang Bao et al., "Novel Materials and Processes in Replacement Metal Gate for Advanced CMOS Technology", IEEE International Electron Devices Meeting, Dec. 2018, pp. 253-256.

L.-Å. Ragnarsson et al., "Zero-thickness Multi Work Function Solutions for N7 bulk FinFETs", Symposium on VLSI Technology Digest of Technical Papers, 2016.

Pei-Chuen Jiang et al., "Influence of Nitrogen Content in WNx on Its Thermal Stability and Electrical Property as a Gate Electrode", Journal of The Electrochemical Society 153(6), 2006 pp. 572-577.

H. Jagannathan et al., "Engineering High Dielectric Constant Materials for Band-Edge CMOS Applications", ECS Transactions 16 (5), 2008, pp. 19-26.

J. K. Schaeffer et al., Application of group electronegativity concepts to the effective work functions of metal gate electrodes on high-κ gate oxides, Microelectronic Engineering 84, 2007, pp. 2196-2200.

* cited by examiner

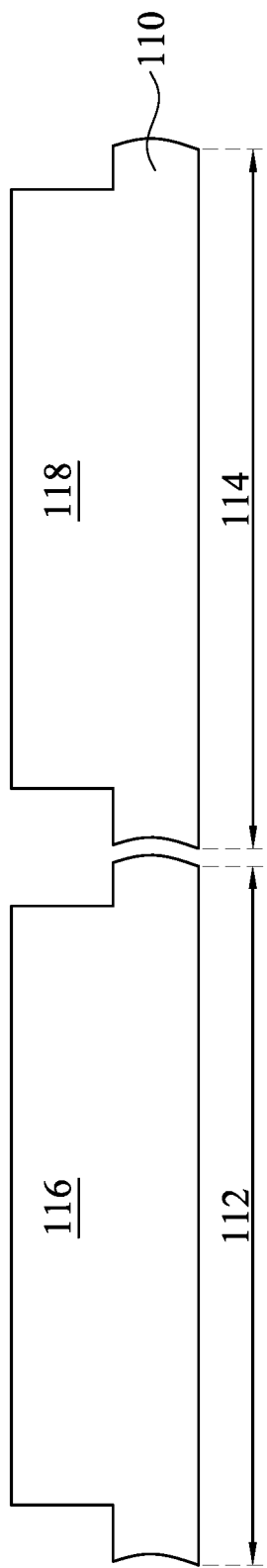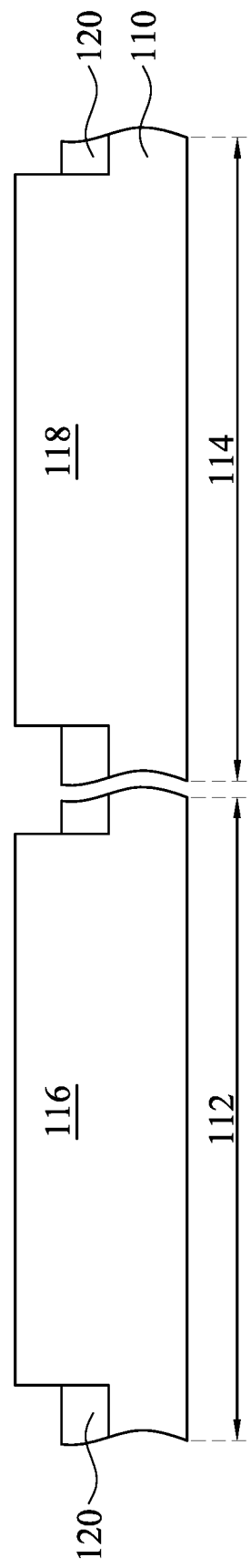

SEMICONDUCTOR DEVICE HAVING DOPED WORK FUNCTION METAL LAYER

CROSS-REFERENCE TO RELATED APPLICATION

This application is a divisional of U.S. patent application Ser. No. 16/548,730, filed Aug. 22, 2019, issued as U.S. patent Ser. No. 11/244,945 on Feb. 8, 2022, which is herein incorporated by reference in its entirety.

BACKGROUND

Semiconductor devices are used in a variety of electronic applications, such as, for example, personal computers, cell phones, digital cameras, and other electronic equipment. Semiconductor devices may be fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that are desired to be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
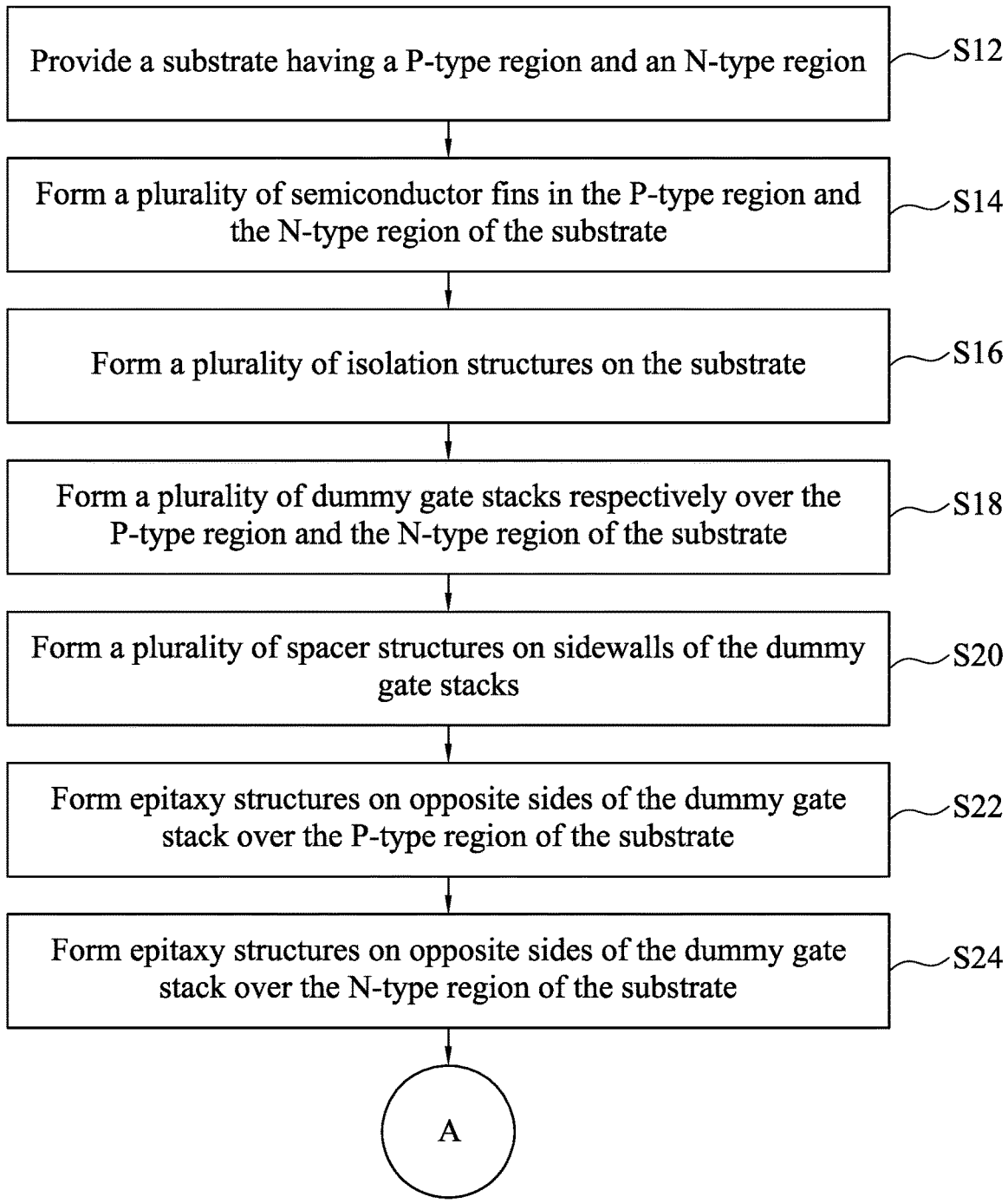
FIGS. 1A and 1B are a flowchart of a method for making a semiconductor device according to aspects of the present disclosure in various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

This disclosure provides a gate stack structure with at least a pair of work function metal layers that generate dipoles therein to implement field effect transistors (FETs) with a tuned threshold voltage. In some embodiments, the gate stack may be realized on the device selected from the group consisting of planar devices, multi-gate devices, Fin-FETs, and gate-all-around FETs.

Figure 1B:
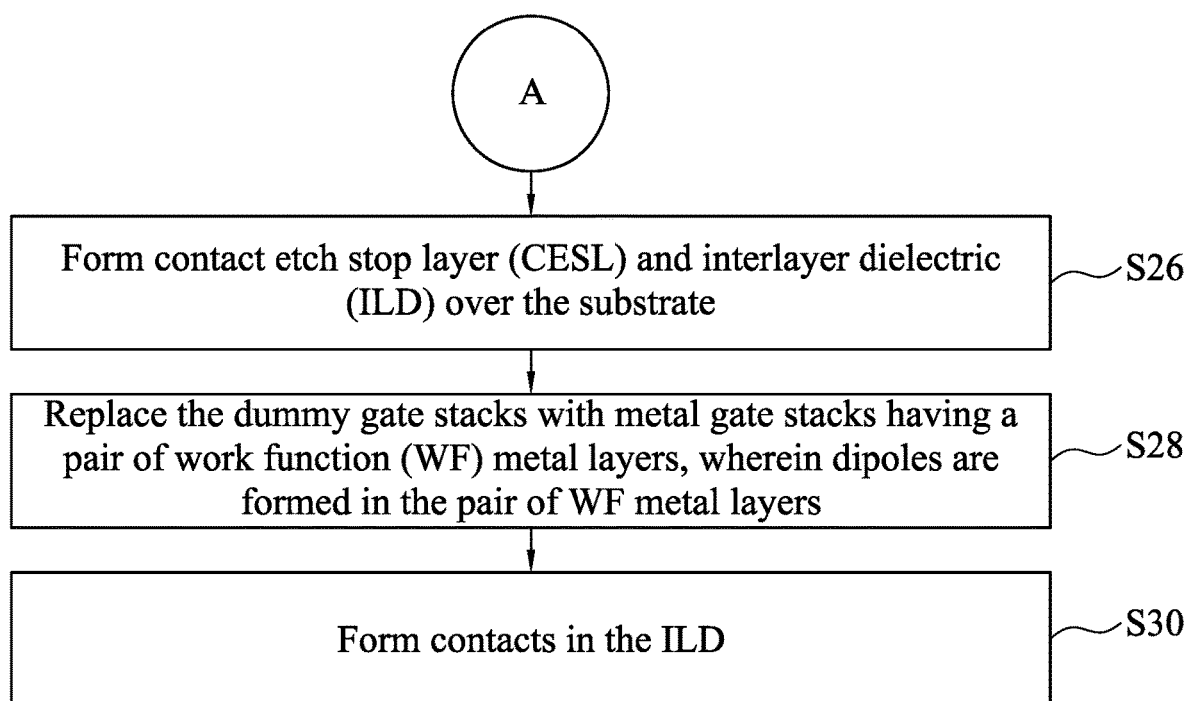

FIGS. 1A and 1B are a flowchart of a method M10 for making a semiconductor device according to aspects of the present disclosure in various embodiments. Various operations of the method M10 are discussed in association with perspective diagrams FIGS. 2A-2N. Throughout the various views and illustrative embodiments, like reference numbers are used to designate like elements. In some embodiments, the semiconductor device as shown in FIGS. 2A-2N may be intermediate devices fabricated during processing of an IC, or a portion thereof, that may include static random access memory (SRAM) and/or logic circuits, passive components such as resistors, capacitors, and inductors, and active components such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

In operation S12 of method M10, a substrate 110 is provided, as shown in FIG. 2A. The substrate 110 has a P-type region 112 and an N-type region 114. In some embodiments, the substrate 110 may be a semiconductor material and may include a graded layer or a buried oxide, for example. In some embodiments, the substrate 110 includes bulk silicon that may be undoped or doped (e.g., p-type, n-type, or a combination thereof). Other materials that are suitable for semiconductor device formation may be used. Other materials, such as germanium, GaAs, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer.

In operation S14 of method M10, a plurality of semiconductor fins 116 and 118 are respectively formed in the P-type region 112 and the N-type region 114 of the substrate 110, as shown in FIG. 2A. In some embodiments, the semiconductor fins 116 and 118 include silicon. It is note that the number of the semiconductor fins 116 and 118 in FIG. 2A is illustrative, and should not limit the claimed scope of the present disclosure. For example, in FIG. 2A, the number of the semiconductor fin 116 is one, and the number of the semiconductor fin 118 is one. However, in some other embodiments, the numbers of the semiconductor fins 116 and 118 may both be greater than one.

The semiconductor fins 116 and 118 may be formed, for example, by patterning and etching the substrate 110 using photolithography techniques. Hence, the semiconductor fins 116 and 118 are integrally formed. In some embodiments, a layer of photoresist material (not shown) is deposited over the substrate 110. The layer of photoresist material is irradiated (exposed) in accordance with a desired pattern (the semiconductor fins 116 and 118 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In operation S16 of method M10, a plurality of isolation structures 120 are formed on the substrate 110, as shown in FIG. 2B. The isolation structures 120 may be formed by chemical vapor deposition (CVD) techniques using tetra-ethyl-ortho-silicate (TEOS) and oxygen as a precursor. In some other embodiments, the isolation structures 120 may be formed by implanting ions, such as oxygen, nitrogen, carbon, or the like, into the substrate 110. In yet some other embodiments, the isolation structures 120 are insulator layers of a SOI wafer. At least one of the isolation structures 120 is in contact with the semiconductor fins 116 and 118.

The isolation structures 120, which act as shallow trench isolations (STIs), are formed both in the P-type region 112 and the N-type region 114. The portion of the isolation structures 120 formed in the P-type region 112 surrounds the semiconductor fin 116, and another portion of the isolation structures 120 formed in the N-type region 114 surrounds the semiconductor fin 118.

Figure 2C:
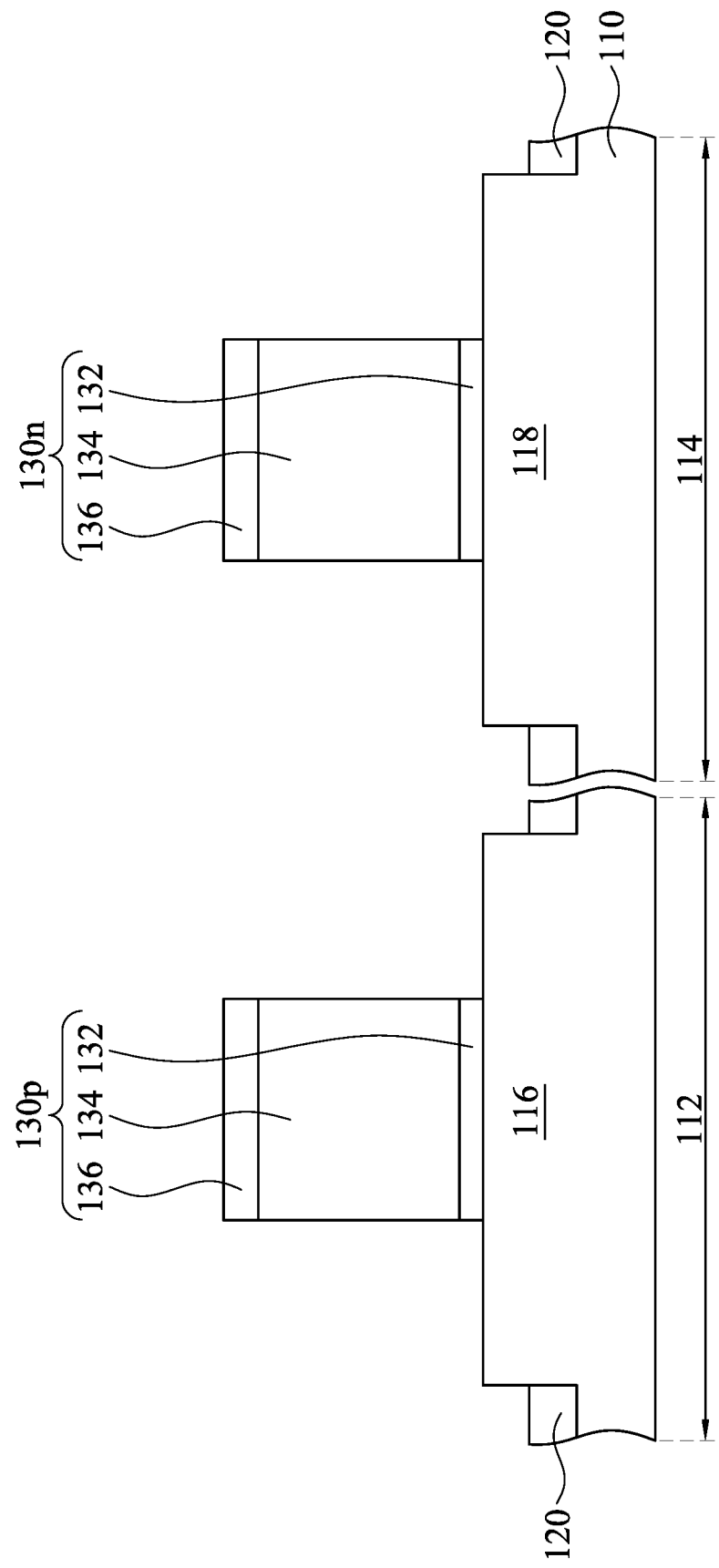
FIGS. 2A to 2N respectively illustrate cross-sectional views of the semiconductor device at various stages in accordance with some embodiments of the present disclosure.

In operation S18 of method M10, a plurality of dummy gate stacks 130p and 130n are respectively formed over the P-type region 112 and the N-type region 114 of the substrate 110, as shown in FIG. 2C. The dummy gate stack 130p (130n) includes a dummy dielectric layer 132, a dummy gate electrode 134 formed over the dummy dielectric layer 132, and a hard mask layer 136 formed over the dummy gate electrode 134. In some embodiments, a dummy dielectric film and a dummy gate layer (not shown) may be sequentially formed over the substrate 110, and the hard mask layer 136 is formed over the dummy gate layer. The dummy gate layer and the dummy dielectric film are then patterned using the hard mask layer 136 as a mask to form the dummy gate electrode 134 and the dummy dielectric layer 132. As such, the dummy dielectric layer 132, the dummy gate electrode 134 and the hard mask layer 136 are referred to as the dummy gate stack 130p (130n). In some embodiments, the dummy dielectric layer 132 may include silicon dioxide, silicon nitride, a high-κ dielectric material or other suitable material. In various examples, the dummy dielectric layer 132 may be deposited by a thermal process, an ALD process, a CVD process, a subatmospheric CVD (SACVD) process, a flowable CVD process, a PVD process, or other suitable process. In some embodiments, the dummy gate electrode 134 may be made of polycrystalline-silicon (poly-Si), polycrystalline silicon-germanium (poly-SiGe), or other suitable materials. The hard mask layer 136 may be made of silicon nitride or other suitable materials.

Figure 2D:
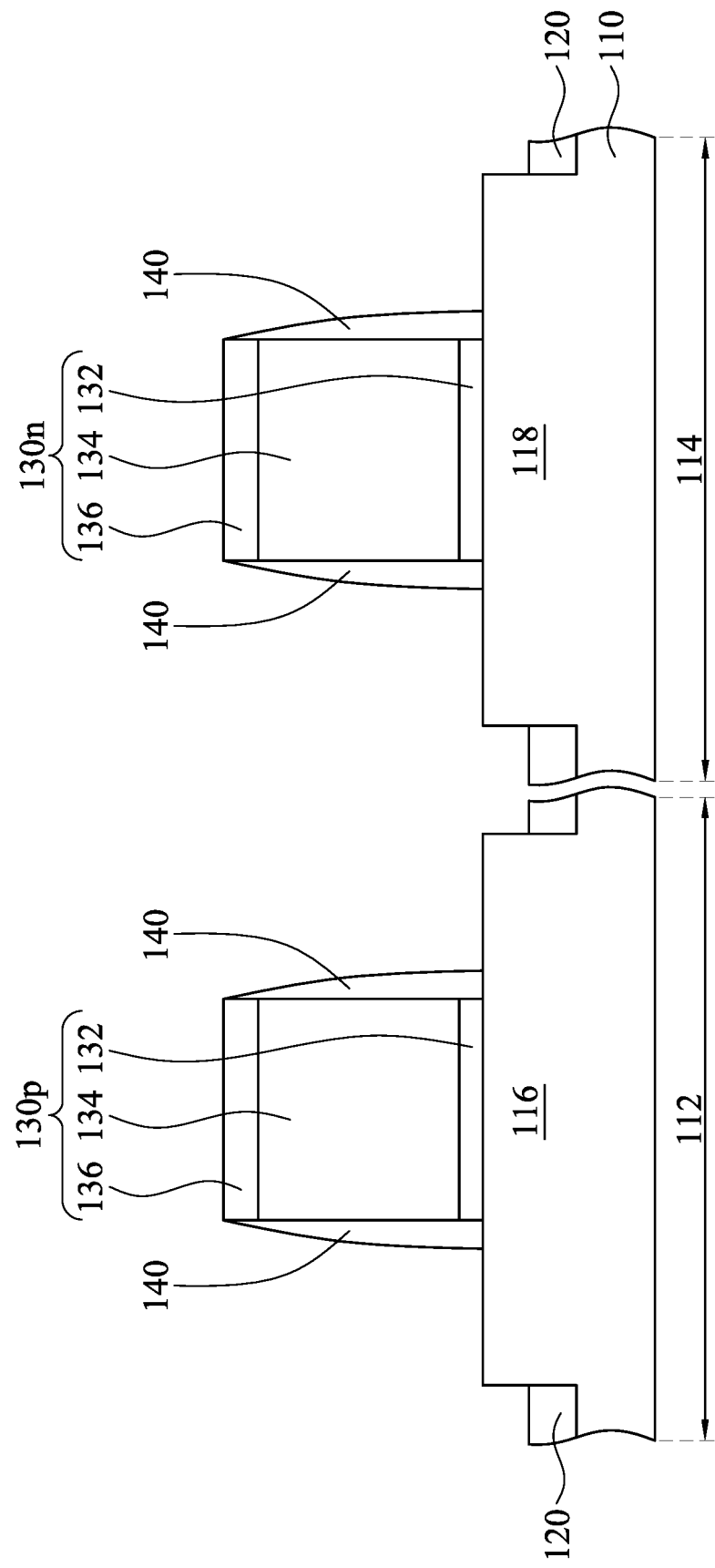

In operation S20 of method M10, a plurality of spacer structures 140 are respectively formed on sidewalls of the dummy gate stacks 130p and 130n, as shown in FIG. 2D. The spacer structure 140 may include a seal spacer and a main spacer (not shown). The spacer structure 140 includes one or more dielectric materials, such as silicon oxide, silicon nitride, silicon oxynitride, SiCN, $SiC_xO_yN_z$, or combinations thereof. The seal spacers are formed on sidewalls of the dummy gate stack 130p and 130n and the main spacers are formed on the seal spacers. The spacer structure 140 may be formed using a deposition method, such as plasma enhanced chemical vapor deposition (PECVD), low-pressure chemical vapor deposition (LPCVD), subatmospheric chemical vapor deposition (SACVD), or the like. The formation of the spacer structure 140 may include blanket forming spacer layers and then performing etching operations to remove the horizontal portions of the spacer layers. The remaining vertical portions of the spacer layers form the spacer structures 140.

Figure 2E:
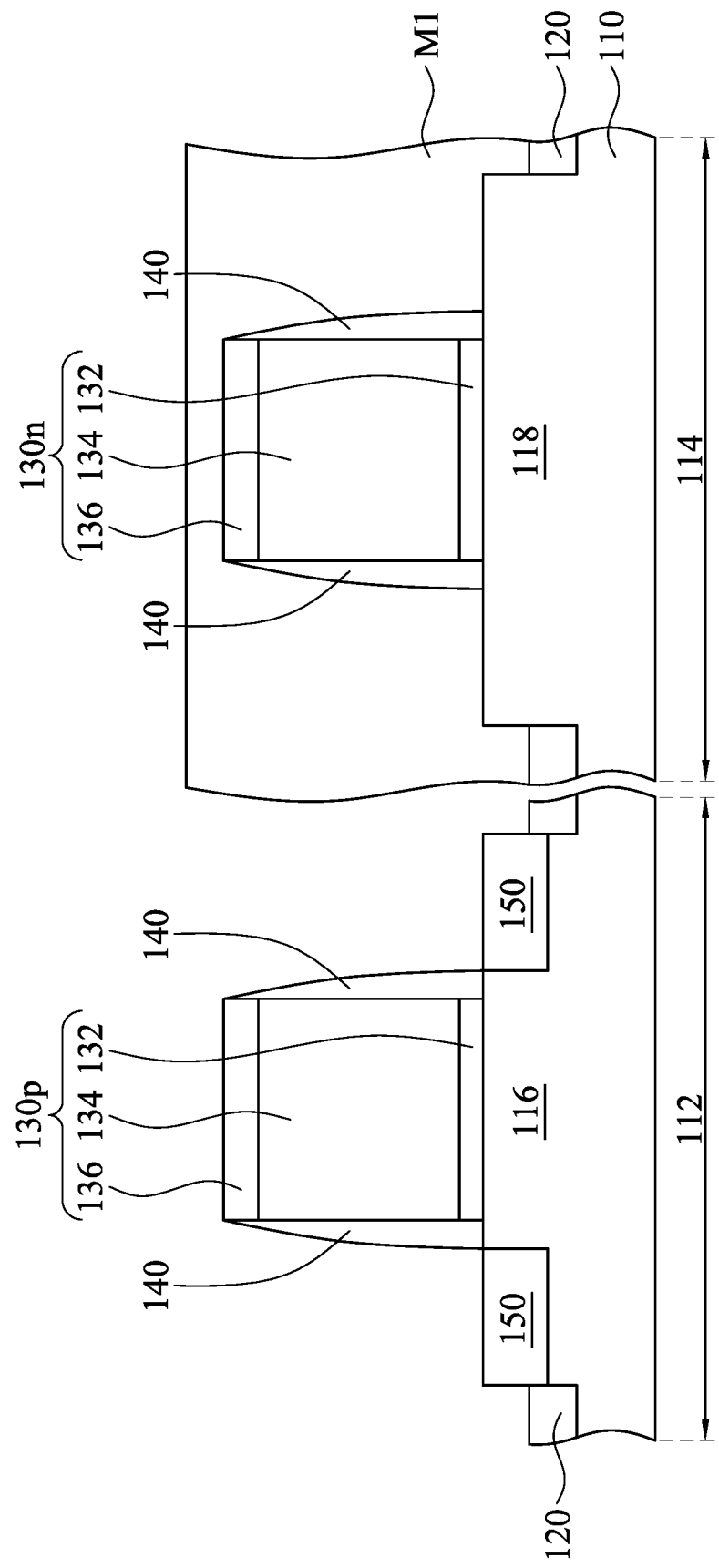

In operation S22 of method M10, epitaxy structures 150 are formed on opposite sides of the dummy gate stack 130p over the P-type region 112, as shown in FIG. 2E. In some embodiments, a mask M1 may be formed on the N-type region 114 of the substrate 110. Then, epitaxy structures 150 are formed on portions of the semiconductor fin 116 uncovered by the dummy gate stack 130p, the spacer structure 140, and the mask M1 by performing, for example, a selectively growing process. The epitaxy structures 150 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxy structures 150 have suitable crystallographic orientations (e.g., a (100), (110), or (111) crystallographic orientation). In some embodiments, the epitaxy structures 150 include source/drain epitaxial structures. In some embodiments, where a P-type device is desired, the epitaxy structures 150 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 2F:
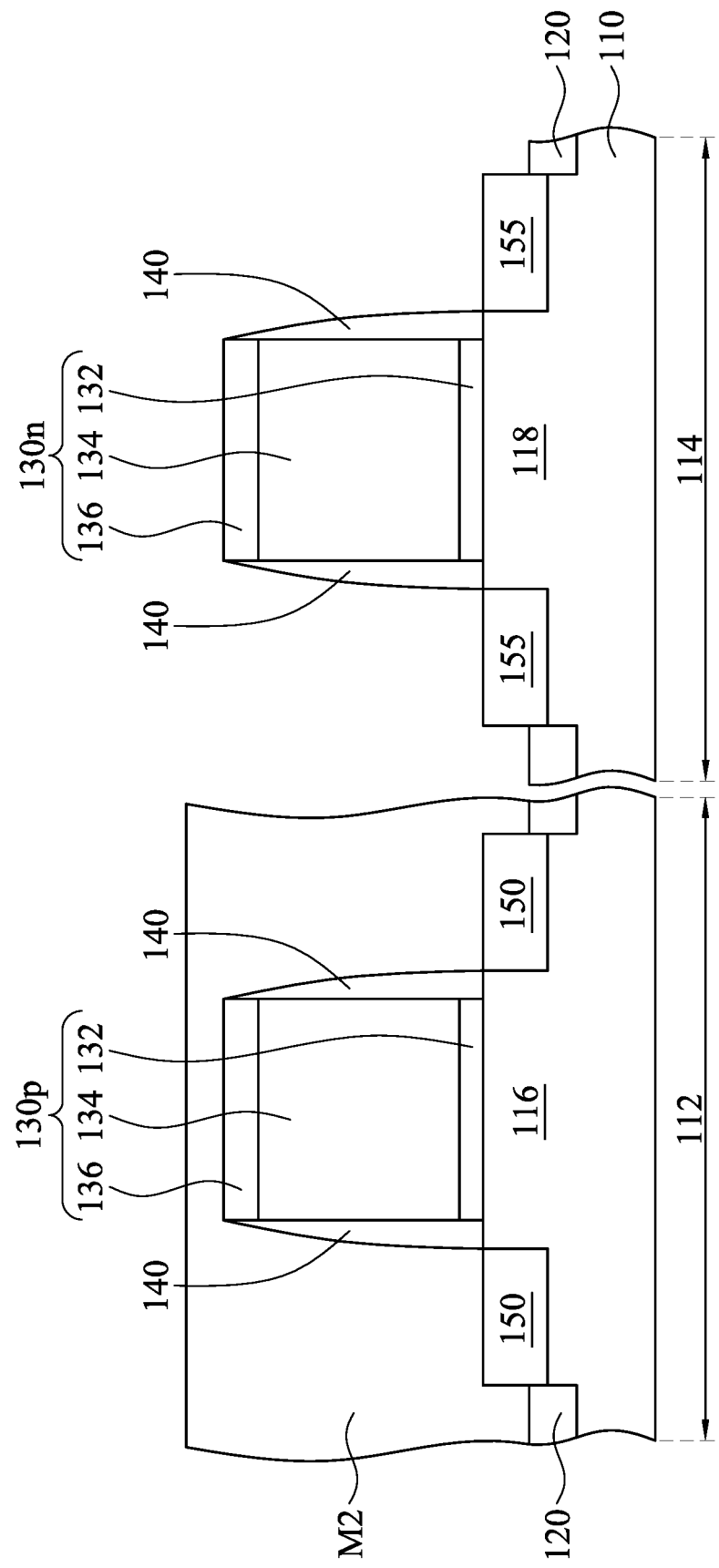

In operation S24 of method M10, epitaxy structures 155 are formed on opposite sides of the dummy gate stack 130n over the N-type region 114, as shown in FIG. 2F. In some embodiments, the mask M1 in FIG. 2E is removed, and then another mask M2 is formed on the P-type region 112 of the substrate 110. Then, epitaxy structures 155 are formed on portions of the semiconductor fin 118 uncovered by the dummy gate stack 130n, the spacer structure 140, and the mask M2 by performing, for example, a selectively growing process. The epitaxy structures 155 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxy structures 155 have suitable crystallographic orientations (e.g., a (100), (110), or (111) crystallographic orientation). In some embodiments, the epitaxy structures 150 include source/drain epitaxial structures. In some embodiments, where an N-type device is desired, the epitaxy structures 155 may include an epitaxially growing silicon phosphorus (SiP) or silicon carbon (SiC). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 2G:
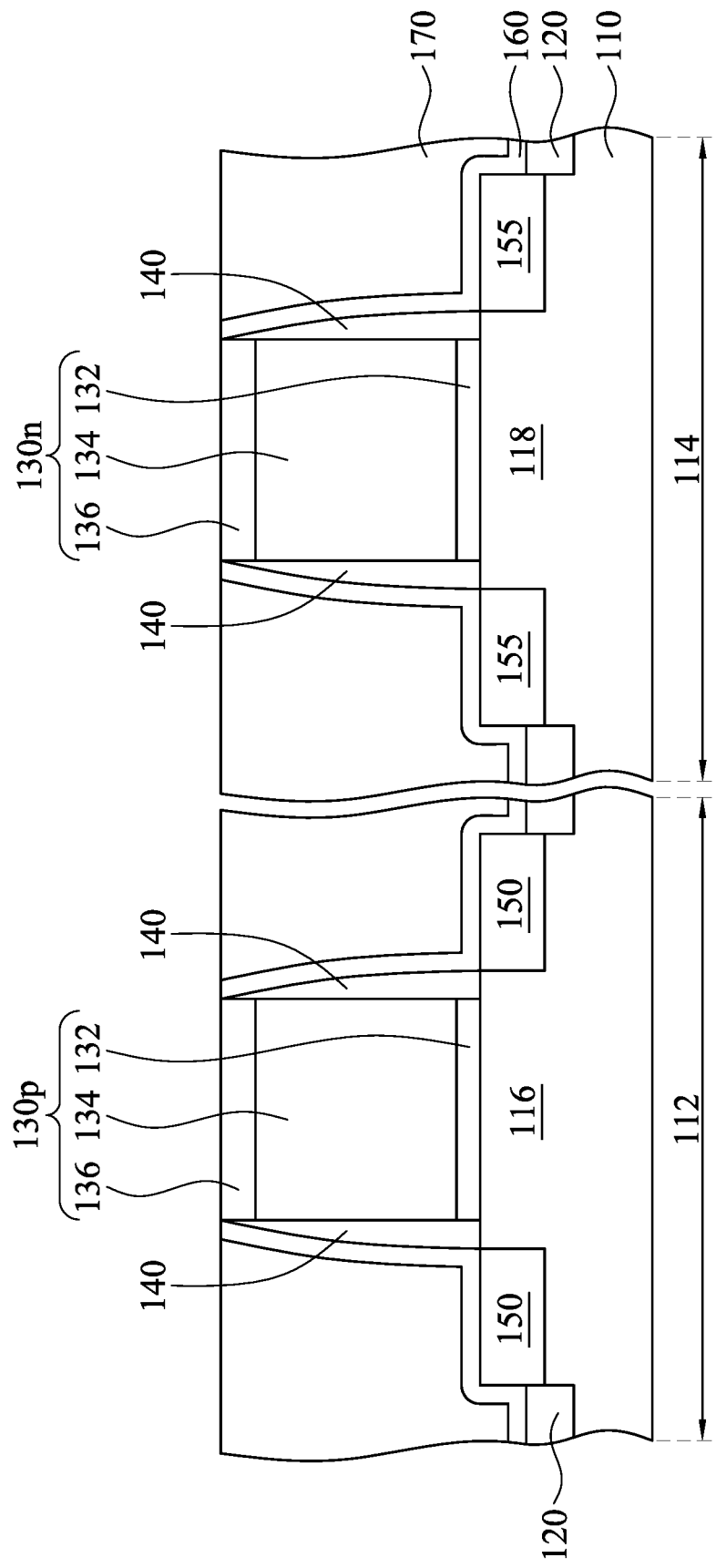

In operation S26 of method M10, a contact etch stop layer (CESL) 160 and an interlayer dielectric (ILD) 170 are formed over the substrate 110, as shown in FIG. 2G. Specifically, the mask M2 (see FIG. 2F) is removed before the formation of the CESL 160. In some embodiments, the CESL 160 may be a stressed layer or layers. In some embodiments, the CESL 160 has a tensile stress and is formed of $Si_3N_4$. In some other embodiments, the CESL 160 includes materials such as oxynitrides. In yet some other embodiments, the CESL 160 may have a composite structure including a plurality of layers, such as a silicon nitride layer overlying a silicon oxide layer. The CESL 160 can be formed using plasma enhanced CVD (PECVD), however, other suitable methods, such as low pressure CVD (LPCVD), atomic layer deposition (ALD), and the like, can also be used.

Then, the ILD 170 is formed over the CESL 160. The ILD 170 covers the CESL 160. In some embodiments, the ILD 170 may be formed by depositing a dielectric material over the CESL 160 and then a planarization process is performed to the dielectric material and the CESL 160 to expose the dummy gate stacks 130$p$ and 130$n$. In some embodiments, the deposition process may be chemical vapor deposition (CVD), high-density plasma CVD, spin-on, sputtering, or other suitable methods. In some embodiments, the ILD 170 includes silicon oxide. In some other embodiments, the ILD 170 may include silicon oxy-nitride, silicon nitride, or a low-k material.

Figure 2H:
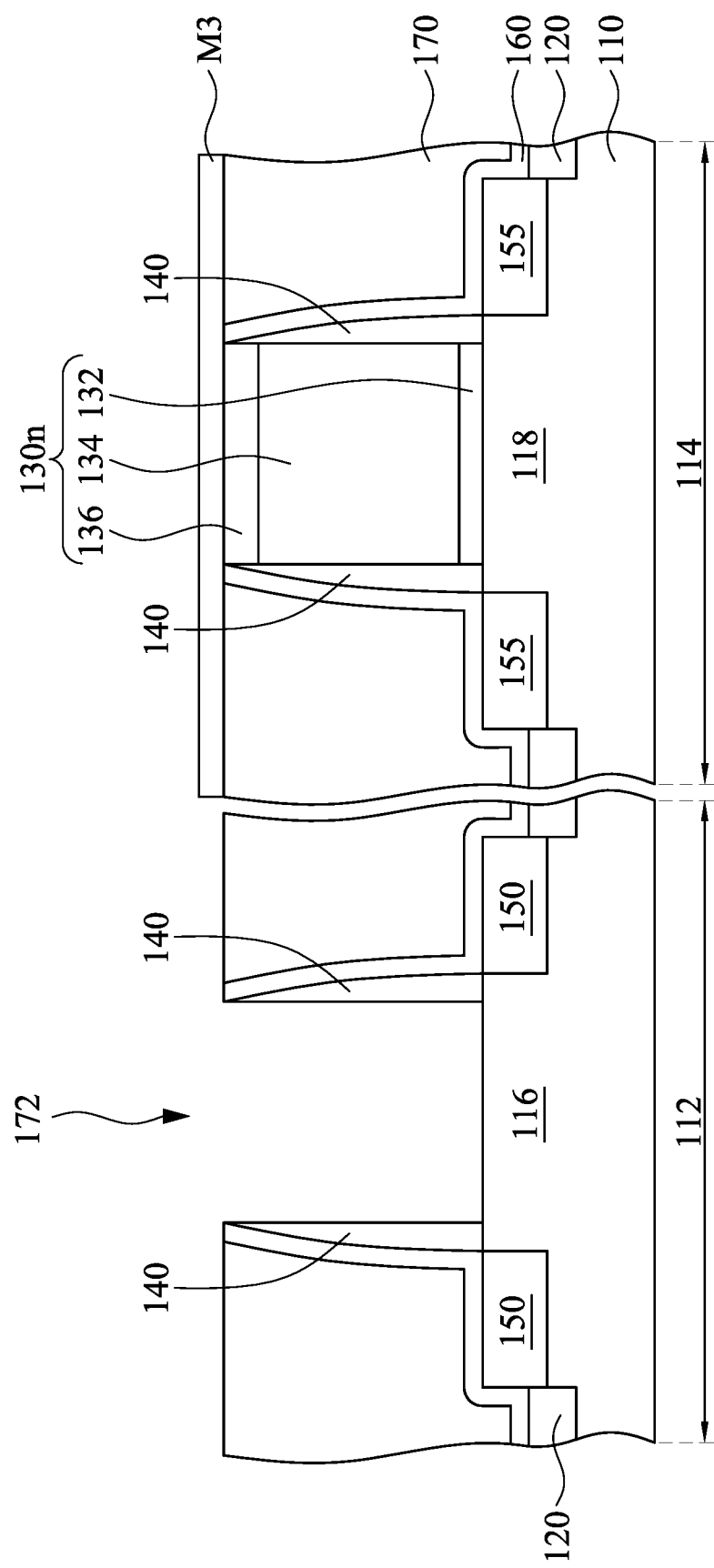

In operation S28 of method M10, the dummy gate stacks 130$p$ and 130$n$ are replaced with metal gate stacks individually having a pair of work function (WF) metal layers, wherein dipoles are formed in the pair of WF metal layers, as shown in FIGS. 2H-2M. Specifically, a replacement gate (RPG) process scheme is employed. In the RPG process scheme, a dummy polysilicon gate (the dummy gate electrode 134 (see FIG. 2G) in this case) is formed in advance and is replaced later by a metal gate. In some embodiments, as shown in FIG. 2H, another mask M3 (may be a hard mask such as $Si_3N_4$) is formed over the N-type region 114 of the substrate 110, and the dummy gate stack 130$p$ is removed to form an opening 172 with the spacer structure 140 as its sidewall. In some other embodiments, the dummy dielectric layer 132 (see FIG. 2G) is removed as well. Alternatively, in some embodiments, the dummy gate electrode 134 is removed while the dummy dielectric layer 132 retains. The dummy gate stack 130$p$ may be removed by dry etch, wet etch, or a combination of dry and wet etch.

Figure 2I:
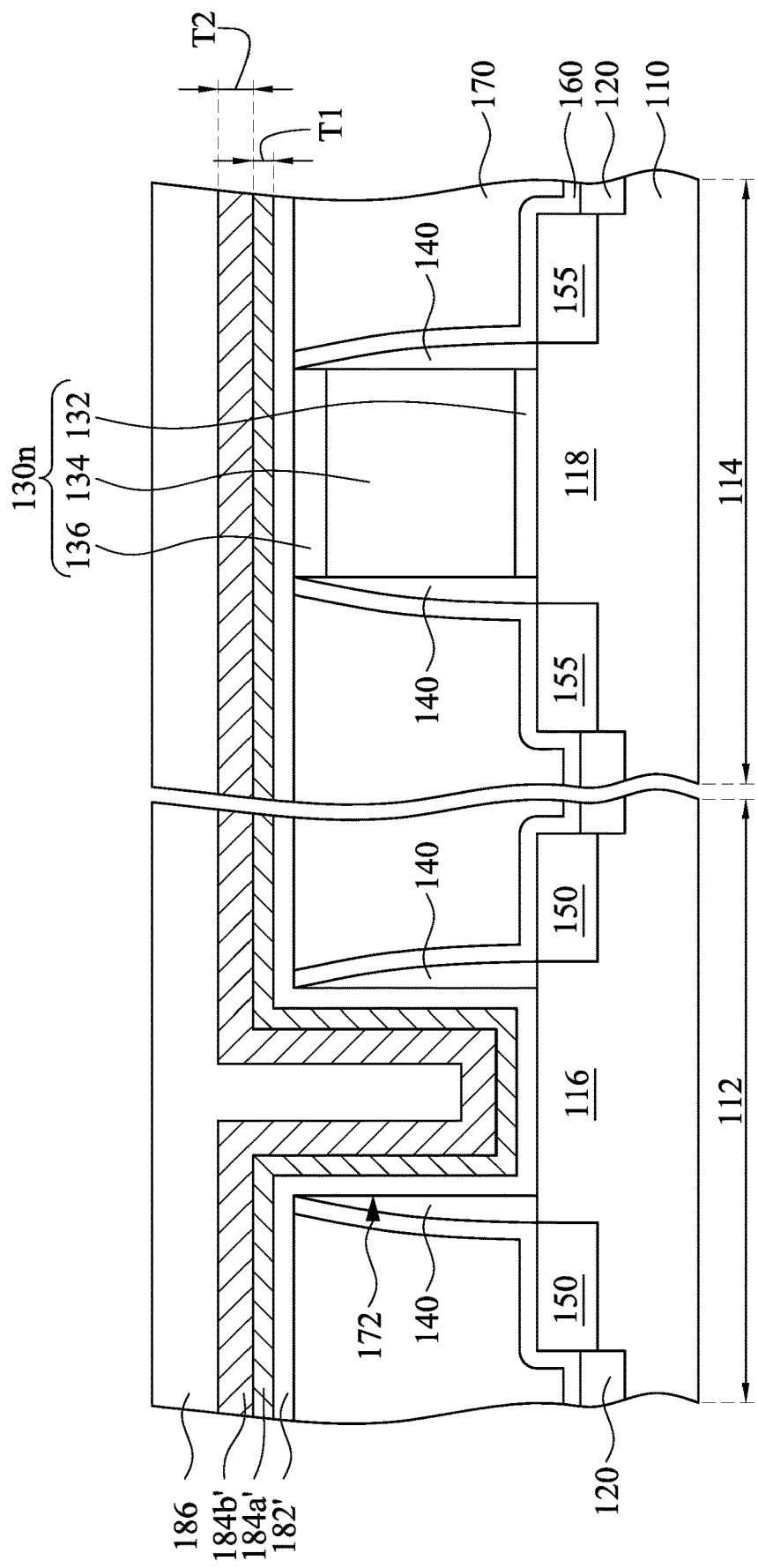

Referring to FIG. 2I, after the opening 172 is formed, the mask M3 of FIG. 2H is removed. Then, a gate dielectric layer 182' is formed in the opening 172. The gate dielectric layer 182' is over the semiconductor fin 116. The gate dielectric layer 182' can be a high-κ dielectric layer having a dielectric constant (κ) higher than the dielectric constant of $SiO_2$, i.e. κ>3.9. The gate dielectric layer 182' may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), or other suitable materials. The gate dielectric layer 182' is deposited by suitable techniques, such as ALD, CVD, PVD, thermal oxidation, combinations thereof, or other suitable techniques.

Then, a bottom work function (WF) metal layer 184$a$' is conformally formed over the gate dielectric layer 182'. The bottom WF metal layer 184$a$' may include metals and their nitrides (e.g. TiN, TaN, $W_2N$, TiSiN, TaSiN) with dopants (such as oxygen), or combinations thereof. The dopants in the bottom WF metal layer 184$a$' are configured to tune the group electronegativity thereof, which will be described with the following formed top WF metal layer 184$b$'. The WF metal layer 184$a$' may be deposited by PVD, CVD, Metal-organic chemical vapor deposition (MOCVD) or atomic layer deposition (ALD).

In some embodiments, the bottom WF metal layer 184$a$' is formed by performing an ALD process. Atomic layer deposition (ALD) is an approach to filling materials that involves depositing a monolayer of precursor over the substrate 110, purging the chamber, and introducing a reactant that reacts with the precursor to leave a monolayer of product. The cycle can be repeated many times to build a layer with a sufficient thickness to be functional. In FIG. 2I, the bottom WF metal layer 184$a$' has a thickness T1, which is determined by the deposition cycles of ALD processes. In some embodiments, the bottom WF metal layer 184$a$' is formed by performing m cycles of the ALD process to achieve the thickness T1. In some embodiments, the thickness T1 is in a range of about 0.1 nm to about 10 nm.

During the ALD processes, the wafer is positioned on a chuck in an ALD process chamber. A vacuum is then applied to the ALD process chamber and the temperature is raised to an acceptable level that is suitable for the ALD deposition. Precursors are then fed into the ALD process chamber. The precursors form a conformal monolayer over the gate dielectric layer 182'. In some embodiments, for doping the monolayer, the operating temperature may be reduced to increase the oxygen content in the monolayer. Alternatively, process gases may be fed into the ALD process chamber. The process gases are oxygen-containing gases, such as $O_2$, $H_2O$, and/or other suitable gases.

Then, a top WF metal layer 184$b$' is conformally formed over the bottom WF metal layer 184$a$'. The top WF metal layer 184$b$' may be deposited by PVD, CVD, Metal-organic chemical vapor deposition (MOCVD) or ALD. In some embodiments, the top WF metal layer 184$b$' is the bottom WF metal layer 184$a$' without dopants. That is, the bottom WF metal layer 184$a$' includes the material the same as the top WF metal layer 184$b$' and further includes dopants. For example, the top WF metal layer 184$b$' may be $WN_x$, and the bottom WF metal layer 184$a$' may be $W_{1-x-y}N_xO_y$, where the dopants are oxygen. In FIG. 2I, the top WF metal layer 184$b$' has a thickness T2, which is determined by the deposition cycles of ALD processes. In some embodiments, the top WF metal layer 184$b$' is formed by performing n cycles of the ALD process to achieve the thickness T2. In some embodiments, the thickness T2 is in a range of about 0.1 nm to about 10 nm.

In some embodiments, since the bottom WF metal layer 184$a$' and the top WF metal layer 184$b$' include the same elements (e.g., W and N), the bottom WF metal layer 184$a$' and the top WF metal layer 184$b$' may be in-situ formed. Herein, the term "in-situ" means that the top WF metal layer 184b' is formed in an ALD process chamber where the bottom WF metal layer 184a' is formed, without breaking vacuum. In some other embodiments, however, the bottom WF metal layer 184a' and the top WF metal layer 184b' may be ex-situ formed. Herein, the term "ex-situ" means that the top WF metal layer 184b' is formed in an ALD process chamber different from an ALD process chamber where the bottom WF metal layer 184a' is formed.

Then, the remaining opening 172 is filled with a filling metal 186' on the top WF metal layer 184b'. In some embodiments, the filling metal 186' includes the same metal as the work function metal layer 184b', e.g., W in this case. As such, the filling metal 186' and the top WF metal layer 184b' may be formed by using the same precursors. The filling metal 186' is deposited by ALD, PVD, CVD, or other suitable process.

Figure 2J:
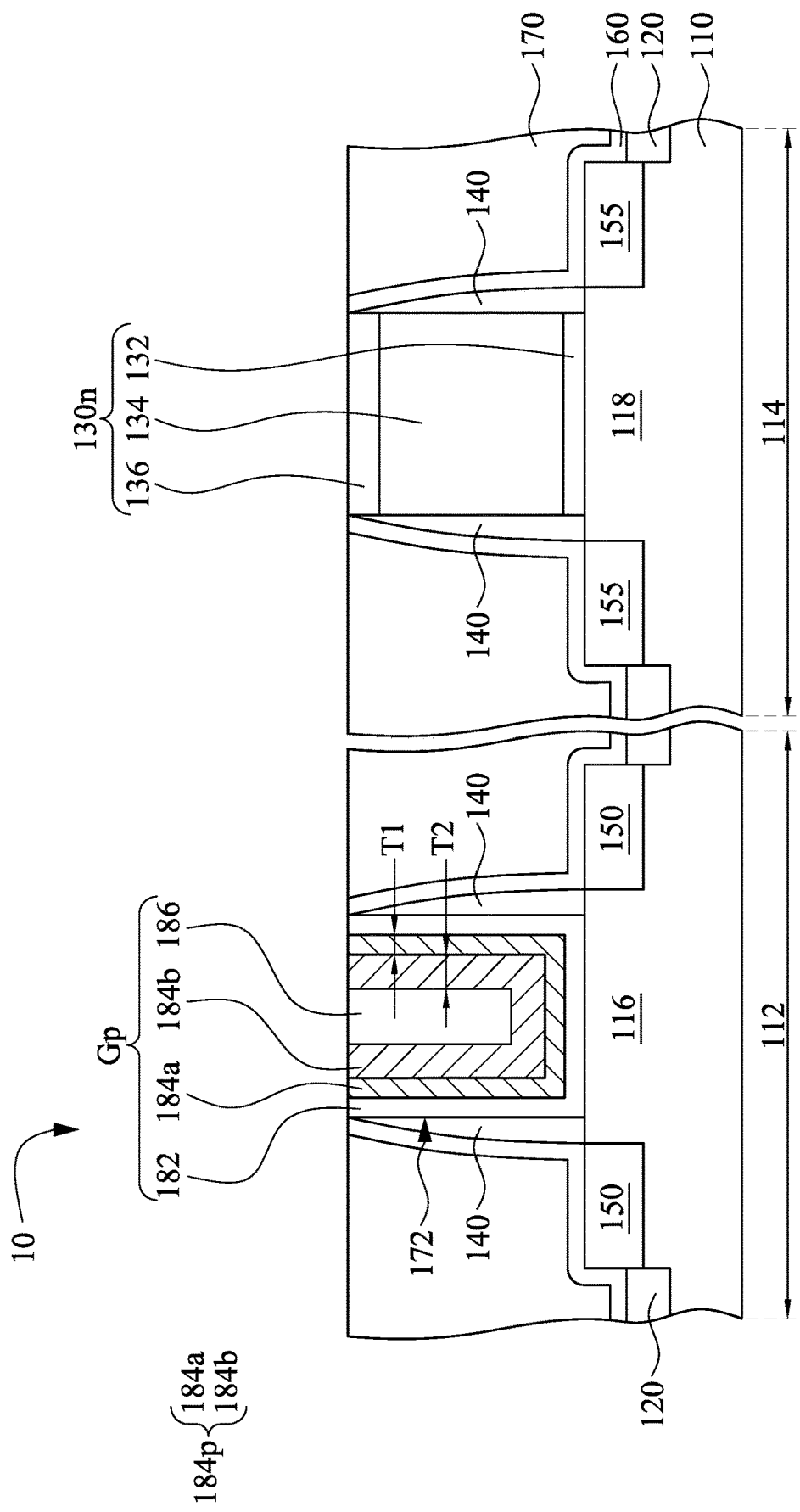

Referring to FIG. 2J. A CMP process is applied to remove excessive the filling metal 186', the top WF metal layer 184b', the bottom WF metal layer 184a', and the gate dielectric layer 182' to provide a substantially planar top surface. The remaining filling metal 186, the remaining top WF metal layer 184b, the remaining bottom WF metal layer 184a, and the remaining gate dielectric layer 182 in the opening 172 form a gate stack Gp of a P-type device 10. Further, the top WF metal layer 184b and the bottom WF metal layer 184a form a pair of WF metal layers 184p, and the top WF metal layer 184b is in contact with the bottom WF metal layer 184a.

Figure 3A:
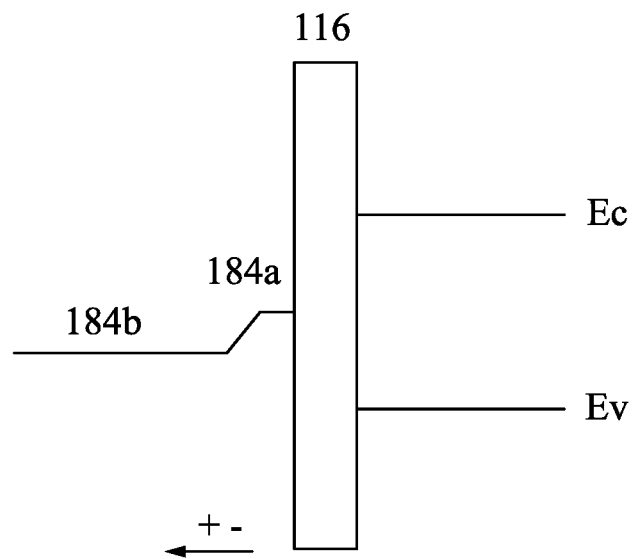
FIG. 3A is a band diagram of the semiconductor fin, the bottom WF metal layer, and the top WF metal layer in FIG. 2J.

FIG. 3A is a band diagram of the semiconductor fin 116, the bottom WF metal layer 184a, and the top WF metal layer 184b in FIG. 2J. Referring to FIGS. 2J and 3A, the bottom WF metal layer 184a and the top WF metal layer 184b have the same material except that the bottom WF metal layer 184a further includes dopants (e.g., oxygen in this case). Therefore, the bottom WF metal layer 184a and the top WF metal layer 184b have different group electronegativities. In this case, since the group electronegativity of oxygen is about 3.44, and the group electronegativity of nitrogen is about 3.04, the bottom WF metal layer 184a is more electrically negative than the top WF metal layer 184b. Dipoles (shown in FIG. 3A) are thus formed at the interface of the bottom WF metal layer 184a and the top WF metal layer 184b. The dipoles direct from the bottom WF metal layer 184a to the top WF metal layer 184b. These dipoles lower the band of the top WF metal layer 184b, such that the band of the top WF metal layer 184b is close to the valence band (Ev). With this configuration, the effective WF of the top WF metal layer 184b increases, and the threshold voltage (Vt) of the metal gate stack Gp can be tuned accordingly.

The intensity of the dipoles depends on the concentration of the oxygen. When the oxygen concentration is increased, the band the top WF metal layer 184b is much closer to the valence band. In some embodiments, the bottom WF metal layer 184a is $W_{1-x-y}N_xO_y$, where x and y are atomic concentrations. In some embodiments, x is from 0 to about 0.5, and y is greater than 0 and lower than or equal to about 0.3. If y is greater than about 0.3, the resistivity of the bottom WF metal layer 184a may be too high.

In some embodiments, the thickness T2 of the top WF metal layer 184b is greater than the thickness T1 of the bottom WF metal layer 184a. That is, the top WF metal layer 184b dominates the effective WF of the pair of WF metal layers 184p. In some embodiments, a ratio of the thickness T1 to T2 is in a range between about 0.025 and about 1. If the ratio is greater than 1, then the bottom WF metal layer 184a will dominate the effective WF. If the ratio is less than 0.025, then the resistance of metal gate becomes large due to less volume in the remaining opening 172 for filling metal deposition.

Figure 2K:
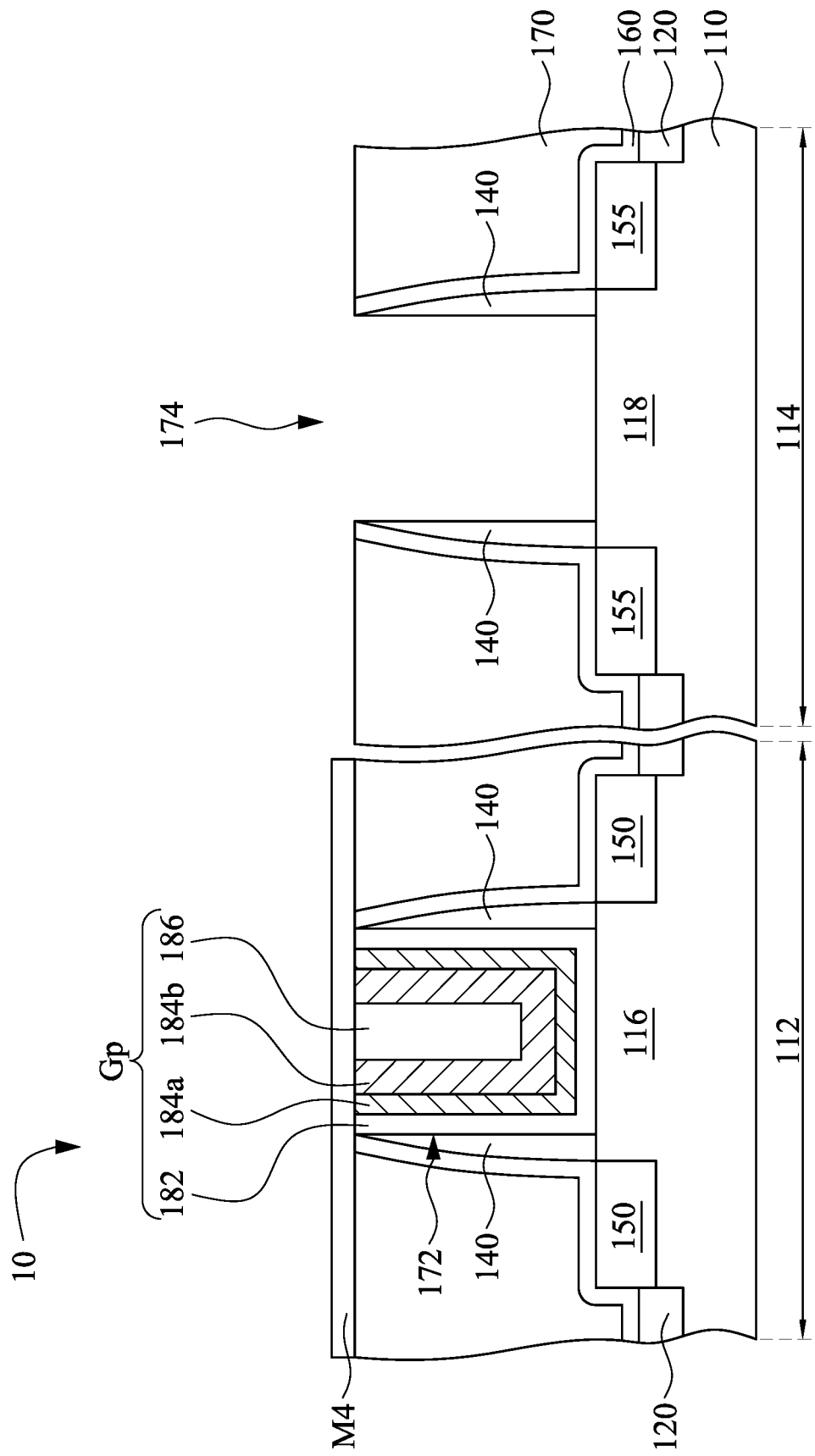

Referring to FIG. 2K, another mask M4 (may be a hard mask such as $Si_3N_4$) is formed over the P-type region 112 of the substrate 110, and the dummy gate stack 130n is removed to form an opening 174 with the spacer structure 140 as its sidewall. In some other embodiments, the dummy dielectric layer 132 (see FIG. 2J) is removed as well. Alternatively, in some embodiments, the dummy gate electrode 134 is removed while the dummy dielectric layer 132 retains. The dummy gate stack 130n may be removed by dry etch, wet etch, or a combination of dry and wet etch.

Figure 2L:
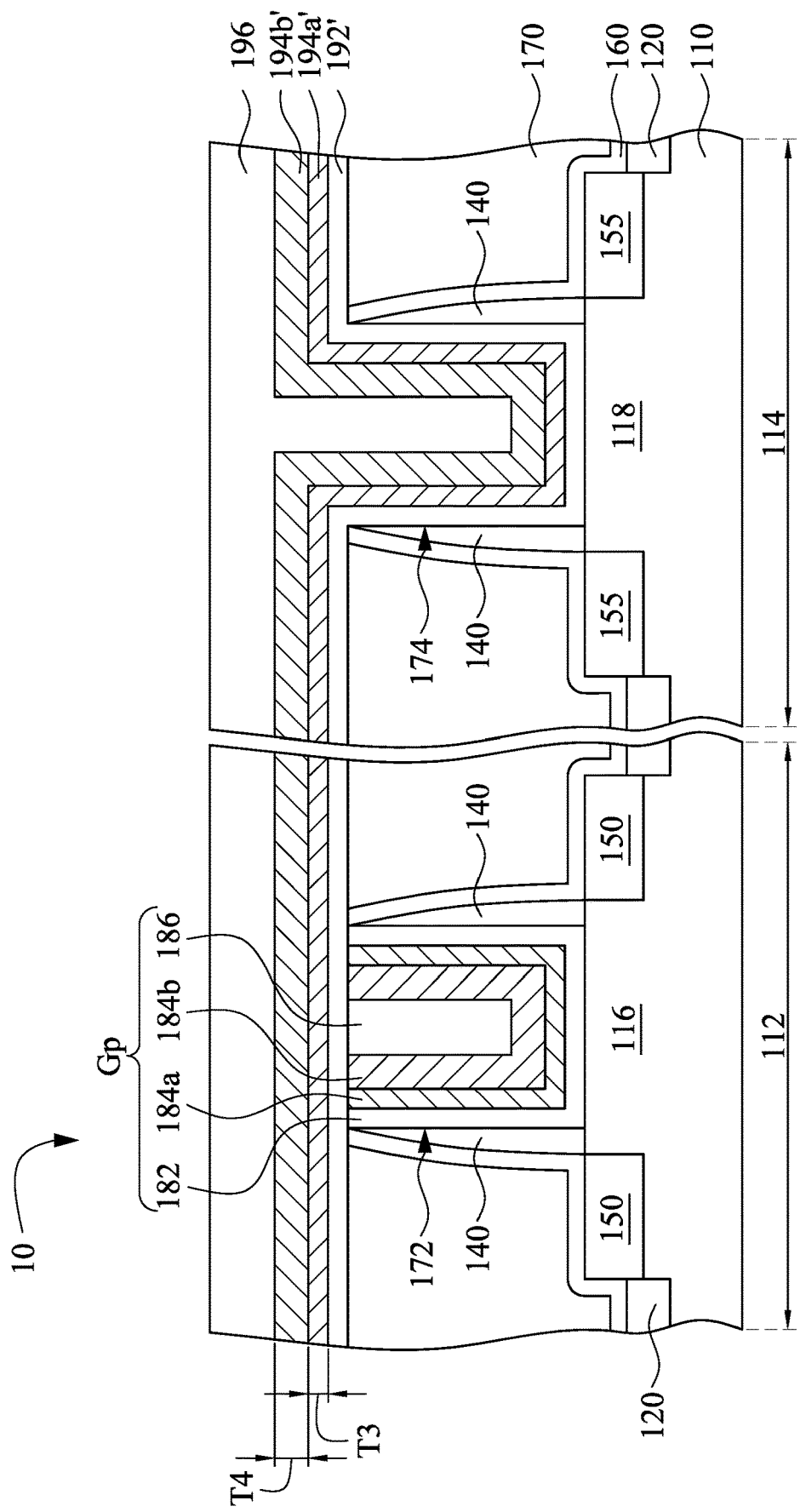

Referring to FIG. 2L, after the opening 174 is formed, the mask M4 of FIG. 2K is removed. Then, a gate dielectric layer 192' is formed in the opening 174. The gate dielectric layer 192' is over the semiconductor fin 118. The gate dielectric layer 192' can be a high-κ dielectric layer having a dielectric constant (κ) higher than the dielectric constant of $SiO_2$, i.e. κ>3.9. The gate dielectric layer 192' may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials. The gate dielectric layer 192' is deposited by suitable techniques, such as ALD, CVD, PVD, thermal oxidation, combinations thereof, or other suitable techniques.

Then, a bottom WF metal layer 194a' is conformally formed over the gate dielectric layer 192'. The bottom WF metal layer 194a' may include metals and their nitrides (e.g. TiN, TaN, $W_2N$, TiSiN, TaSiN), or combinations thereof. The bottom WF metal layer 194a' may be deposited by PVD, CVD, Metal-organic chemical vapor deposition (MOCVD) or atomic layer deposition (ALD).

In some embodiments, the bottom WF metal layer 194a' is formed by performing an ALD process. In FIG. 2L, the bottom WF metal layer 194a' has a thickness T3, which is determined by the deposition cycles of ALD processes. In some embodiments, the bottom WF metal layer 194a' is formed by performing m' cycles of the ALD process to achieve the thickness T3. In some embodiments, the thickness T3 is in a range of about 0.1 nm to about 10 nm.

Then, a top WF metal layer 194b' is conformally formed over the bottom WF metal layer 194a'. The top WF metal layer 194b' may be deposited by PVD, CVD, Metal-organic chemical vapor deposition (MOCVD) or ALD. In some embodiments, the top WF metal layer 194b' is the bottom WF metal layer 194a' with dopants. That is, the top WF metal layer 194b' includes the material the same as the bottom WF metal layer 194a' and further includes dopants. For example, the bottom WF metal layer 194a' may be $WN_x$, and the top WF metal layer 194b' may be $WN_xO_y$, where the dopants are oxygen. In FIG. 2L, the top WF metal layer 194b' has a thickness T4, which is determined by the deposition cycles of ALD processes. In some embodiments, the top WF metal layer 194b' is formed by performing n' cycles of the ALD process to achieve the thickness T4. In some embodiments, the thickness T4 is in a range of about 0.1 nm to about 10 nm.

In some embodiments, since the bottom WF metal layer 194a' and the top WF metal layer 194b' include the same elements (e.g., W and N), the bottom WF metal layer 194a' and the top WF metal layer 194b' may be in-situ formed. In some other embodiments, however, the bottom WF metal layer 194a' and the top WF metal layer 194b' may be ex-situ formed.

Then, the remaining opening 174 is filled with a filling metal 196' on the top WF metal layer 194b'. In some embodiments, the filling metal 196' includes the same metal as the top WF metal layer 194b', e.g., W in this case. That is, the filling metal 196' and the doped WF metal layer 194b' may be formed by using the same precursors. The filling metal 196' is deposited by ALD, PVD, CVD, or other suitable process.

Figure 2M:
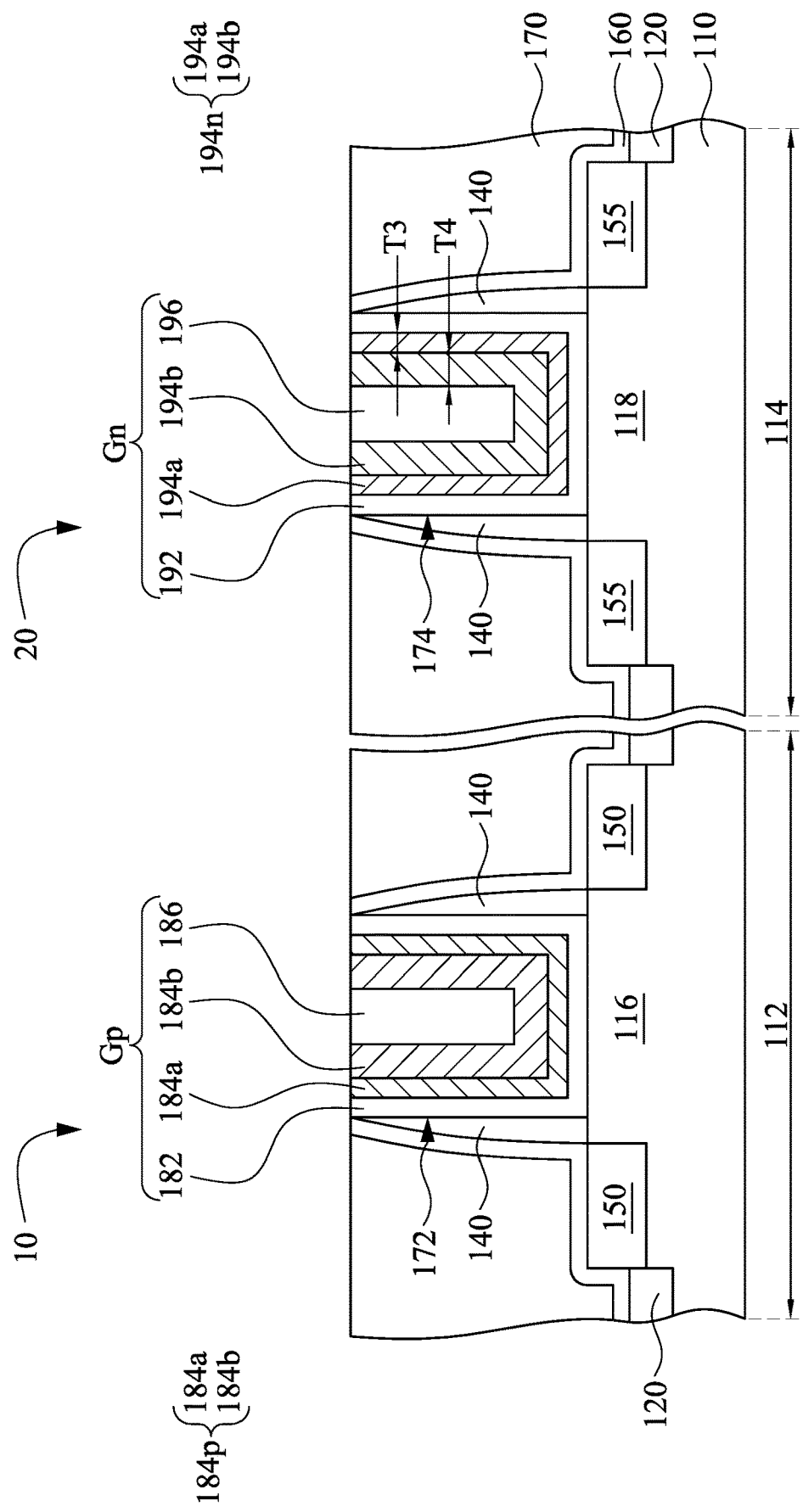
Figure 2N:
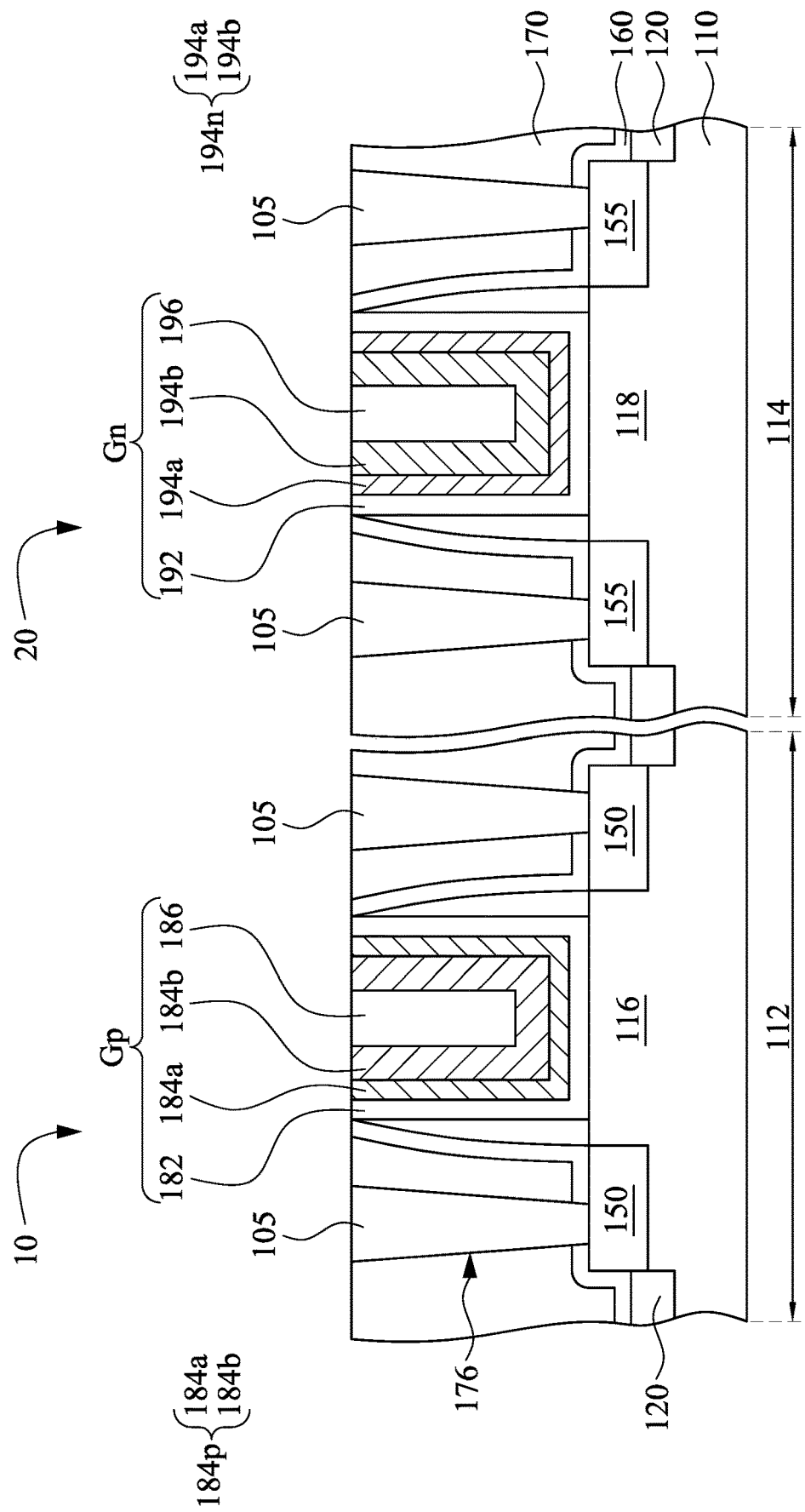

Referring to FIG. 2M. A CMP process is applied to remove excessive the filling metal 196', the top WF metal layer 194b', the bottom WF metal layer 194a', and the gate dielectric layer 192' to provide a substantially planar top surface. The remaining filling metal 196, the remaining top WF metal layer 194b, the remaining bottom WF metal layer 194a, and the remaining gate dielectric layer 192 in the opening 174 form a gate stack Gn of an N-type device 20. Further, the top WF metal layer 194b and the bottom WF metal layer 194a form a pair of WF metal layers 194n, and the top WF metal layer 194b is in contact with the bottom WF metal layer 194a.

Figure 3B:
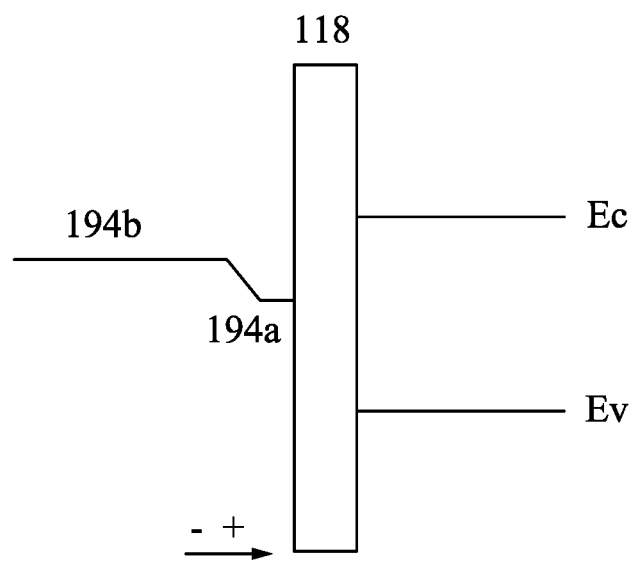
FIG. 3B is a band diagram of the semiconductor fin, the bottom WF metal layer, and the top WF metal layer in FIG. 2M.

FIG. 3B is a band diagram of the semiconductor fin 118, the bottom WF metal layer 194a, and the top WF metal layer 194b in FIG. 2M. Referring to FIGS. 2M and 3B, the bottom WF metal layer 194a and the top WF metal layer 194b have the same material except that the top WF metal layer 194b further includes dopants (e.g., oxygen in this case). Therefore, the bottom WF metal layer 194a and the top WF metal layer 194b have different group electronegativities. In this case, the top WF metal layer 194b is more electrically negative than the bottom WF metal layer 194a. Dipoles (shown in FIG. 3B) are thus formed at the interface of the bottom WF metal layer 194a and the top WF metal layer 194b. The dipoles direct from the top WF metal layer 194b to the bottom WF metal layer 194a. These dipoles raise the band of the top WF metal layer 194b, such that the band of the top WF metal layer 194b is close to the conduction band (Ec). With this configuration, the effective WF of the top WF metal layer 194b decreases, and the threshold voltage (Vt) of the metal gate stack Gn can be tuned accordingly.

The intensity of the dipoles depends on the concentration of the oxygen. When the oxygen concentration is increased, the band the top WF metal layer 194b is much closer to the conduction band. In some embodiments, the top WF metal layer 194b is $W_{1-x-y}N_xO_y$, where x and y are atomic concentrations. In some embodiments, x is from 0 to about 0.5, and y is greater than 0 and lower than or equal to about 0.3. If y is greater than about 0.3, the resistivity of the top WF metal layer 194b may be too high.

In some embodiments, the thickness T4 of the top WF metal layer 194b is greater than the thickness T3 of the bottom WF metal layer 194a. That is, the top WF metal layer 194b dominates the effective WF of the pair of metal layers 194n. In some embodiments, a ratio of the thickness T3 to T4 is in a range of about 0.025 to about 1. If the ratio is greater than 1, then the bottom WF metal layer 194a will dominate the effective WF. If the ratio is less than 0.025, then the resistance of metal gate becomes large due to less volume in the remaining opening 174 for filling metal deposition.

In the P-type device 10, the pair of WF metal layers 184p has a thick layer (i.e., the top WF metal layer 184b in this case) and a thin layer (i.e., the bottom WF metal layer 184a in this case). The thin layer has a group electronegativity higher than the thick layer. Further, the metal layer having higher group electronegativity (i.e., the bottom WF metal layer 184a in this case) is between the gate dielectric layer 182 and the metal layer having lower group electronegativity (i.e., the top WF metal layer 184b in this case).

On contrary, in the N-type device 20, the pair of WF metal layers 194n has a thick layer (i.e., the top WF metal layer 194b in this case) and a thin layer (i.e., the Bottom WF metal layer 194a in this case). The thin layer has a group electronegativity lower than the thick layer. Further, the metal layer having lower group electronegativity (i.e., the bottom WF metal layer 194a in this case) is between the gate dielectric layer 192 and the metal layer having higher group electronegativity (i.e., the top WF metal layer 194b in this case).

In operation S30 of method M10, a plurality of contacts 105 are formed in the ILD 170, as shown in FIG. 2N. Specifically, the ILD 170 is partially removed to form a plurality of openings 176 by various methods, including a dry etch, a wet etch, or a combination of dry etch and wet etch. The openings 176 extend through the ILD 170 and expose the epitaxy structure 150 or 155.

Contacts 105 are respectively formed in the openings 176 and over the epitaxy structure 150 or 155. The contacts 105 are respectively and electrically connected to the epitaxy structure 150 or 155. The contact 105 may include a barrier layer and a filling material formed over the barrier layer. In some embodiments, metal materials can be filled in the openings 176, and excessive portions of the metal materials are removed by performing a planarization process to form the filling materials. In some embodiments, the barrier layers may include one or more layers of a material such as, for example, titanium, titanium nitride, titanium tungsten or combinations thereof. In some embodiments, the filling materials may be made of, for example, tungsten, aluminum, copper, or other suitable materials.

According to the aforementioned embodiments, the metal gate stack includes at least a pair of WF metal layers. The WF metal layers have different group electronegativities. Thus, dipoles are formed at the interface of these two WF metal layers. The intensity of the dipoles relates to the effective WF of the metal gate stack. As such, by tuning the group electronegativities thereof (such as doping at least one of the WF metal layers), the effective WF of the metal gate stack can be tuned. Further, the directions of the dipoles in the P-type device and the N-type device are opposite to each other.

In some other embodiments, operation S28 of the method M10 in FIG. 1B may be performed in other ways. For example, the metal gate stack Gn may be formed before the metal gate stack Gp. That is, the processes in FIGS. 2K-2M may be performed before the processes in FIGS. 2H-2J.

The operation S28 of the method M10 in FIG. 1B may be further performed in other ways. FIGS. 4A-4F respectively illustrate cross-sectional views of the semiconductor device at various stages in accordance with some embodiments of the present disclosure. Throughout the various views and illustrative embodiments, like reference numbers are used to designate like elements. The present embodiment may repeat reference numerals and/or letters used in FIGS. 2A-2N. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 4A-4F.

Figure 4A:
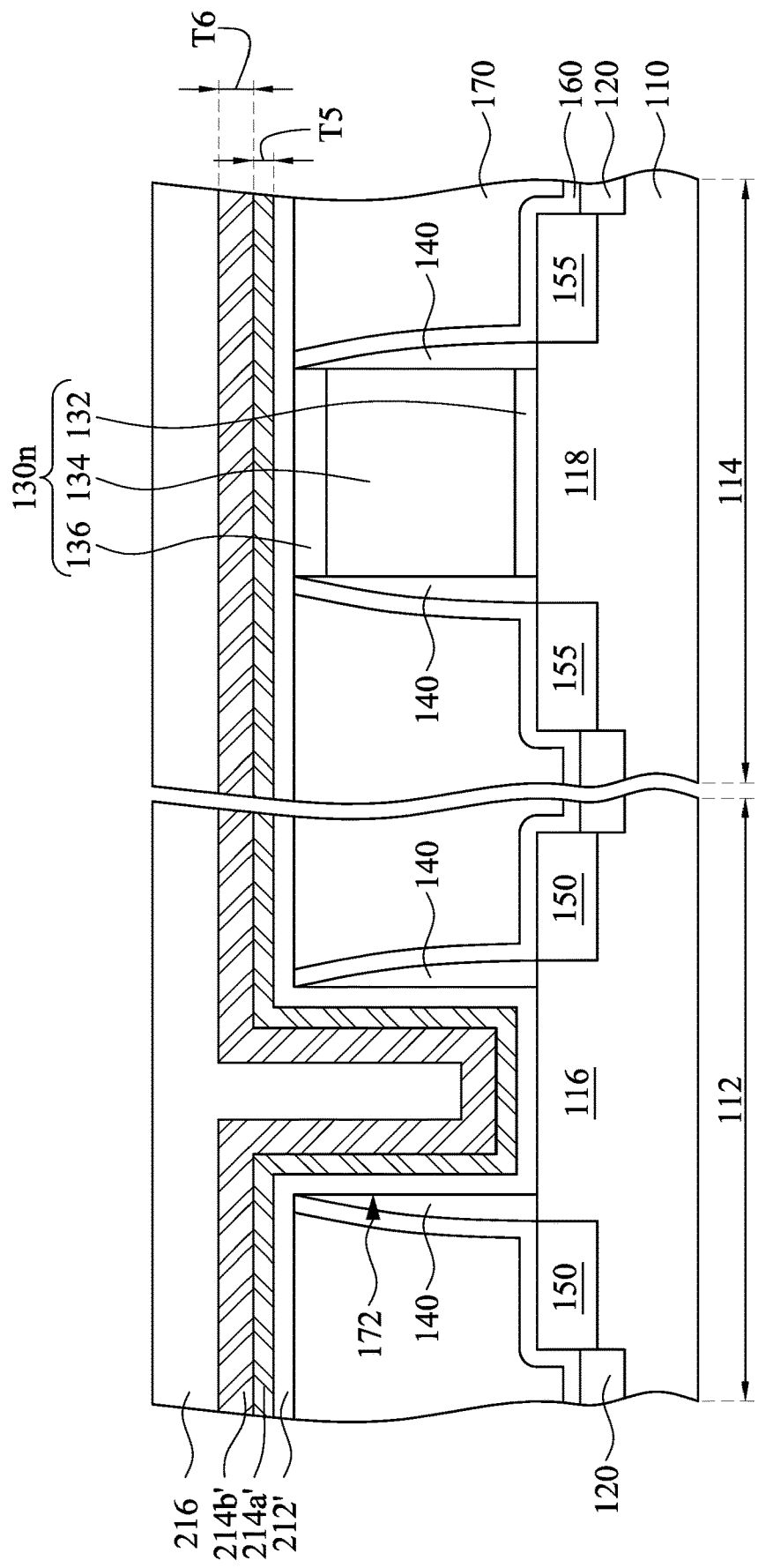
FIGS. 4A to 4F respectively illustrate cross-sectional views of the semiconductor device at various stages in accordance with some embodiments of the present disclosure.

In some embodiments, the manufacturing processes of FIGS. 2A-2H are performed in advance. Since the relevant manufacturing details are similar to FIGS. 2A-2H, and, therefore, a description in this regard will not be repeated hereinafter. Reference is made to FIG. 4A. A gate dielectric layer 212' is formed in the opening 172. The gate dielectric layer 212' and 182' (see FIG. 2I) may have the same or similar materials and/or manufacturing process, such that the details thereof are not repeated hereinafter.

Then, a bottom WF metal layer 214a' is conformally formed over the gate dielectric layer 212'. The bottom WF metal layer 214a' and the top WF metal layer 184b' (see FIG. 2I) may have the same or similar materials and/or manufacturing process, such that the details thereof are not repeated hereinafter. In FIG. 4A, the bottom WF metal layer 214a' has a thickness T5. In some embodiments, the thickness T5 is in a range of about 0.1 nm to about 10 nm.

Then, a top WF metal layer 214b' is conformally formed over the bottom WF metal layer 214a'. The top WF metal layer 214b' may be deposited by PVD, CVD, Metal-organic chemical vapor deposition (MOCVD) or ALD. In some embodiments, the top WF metal layer 214b' is the bottom WF metal layer 214a' with dopants. That is, the top WF metal layer 214b' includes the material the same as the bottom WF metal layer 214a' and further includes dopants. For example, the bottom WF metal layer 214a' may be $WN_x$, and the top WF metal layer 214b' may be $WN_xC_z$, where the dopants are carbon. In FIG. 4A, the top WF metal layer 214b' has a thickness T6. In some embodiments, the thickness T6 is in a range of about 0.1 nm to about 10 nm.

In some embodiments, for doping the monolayer of the top WF metal layer 214b', carbon-containing precursors may be added into the chamber to increase the carbon content in the monolayer. Alternatively, process gases may be fed into the ALD process chamber. The process gases are carbon-containing gases.

In some embodiments, since the bottom WF metal layer 214a' and the top WF metal layer 214b' include the same elements (e.g., W and N), the bottom WF metal layer 214a' and the top WF metal layer 214b' may be in-situ formed. In some other embodiments, however, the bottom WF metal layer 214a' and the top WF metal layer 214b' may be ex-situ formed.

Then, the remaining opening 172 is filled with a filling metal 216' on the top WF metal layer 214b'. In some embodiments, the filling metal 216' includes the same metal as the top WF metal layer 214b', e.g., W in this case. That is, the filling metal 216' and the top WF metal layer 214b' may be formed by using the same precursors. The filling metal 216' is deposited by ALD, PVD, CVD, or other suitable process.

Figure 4B:
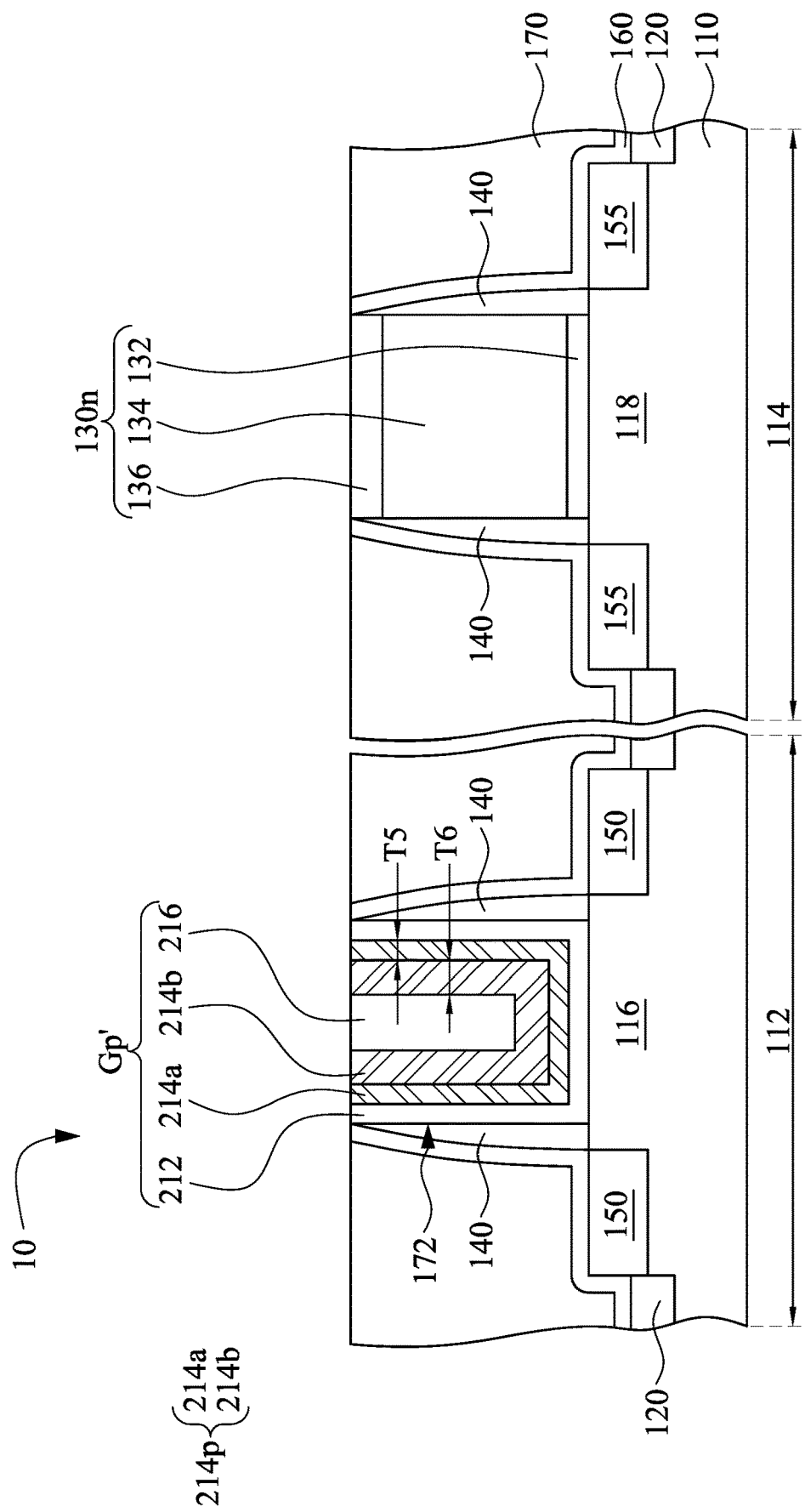

Referring to FIG. 4B, a CMP process is applied to remove excessive the filling metal 216', the bottom WF metal layer 214a', the top WF metal layer 214b', and the gate dielectric layer 212' to provide a substantially planar top surface. The remaining filling metal 216, the remaining bottom WF metal layer 214a, the remaining top WF metal layer 214b, and the remaining gate dielectric layer 212 in the opening 172 form a gate stack Gp' of a P-type device 10. Further, the bottom WF metal layer 214a and the top WF metal layer 214b form a pair of WF metal layers 214p, and the top WF metal layer 214b is in contact with the bottom WF metal layer 214a.

Figure 5A:
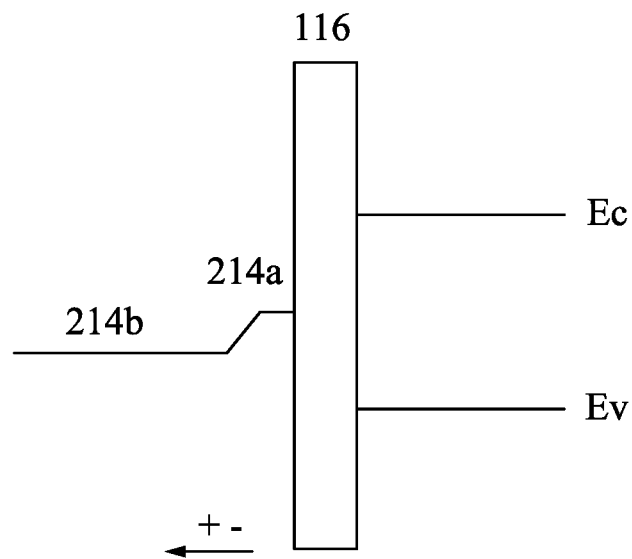
FIG. 5A is a band diagram of the semiconductor fin, the bottom WF metal layer, and the top WF metal layer in FIG. 4B.

FIG. 5A is the band diagram of the semiconductor fin 116, the bottom WF metal layer 214a, and the top WF metal layer 214b in FIG. 4B. Referring to FIGS. 4B and 5A, the top WF metal layer 214b and the bottom WF metal layer 214a have the same material except that the top WF metal layer 214b further includes dopants (e.g., carbon in this case). Therefore, the top WF metal layer 214b and the bottom WF metal layer 214a have different group electronegativities. In this case, since the group electronegativity of carbon is about 2.05, and the group electronegativity of nitrogen is about 3.04, the top WF metal layer 214b is more electrically positive than the bottom WF metal layer 214a. Dipoles (shown in FIG. 5A) are thus formed at the interface of the top WF metal layer 214b and the bottom WF metal layer 214a. The dipoles direct from the bottom WF metal layer 214a to the top WF metal layer 214b. These dipoles lower the band of the top WF metal layer 214b, such that the band of the top WF metal layer 214b is close to the valence band (Ev). With this configuration, the effective WF of the top WF metal layer 214b increases, and the threshold voltage (Vt) of the metal gate stack Gp' can be tuned accordingly.

The intensity of the dipoles depends on the concentration of the carbon. When the carbon concentration is increased, the band the top WF metal layer 214b is much closer to the valence band. In some embodiments, the top WF metal layer 214b is $W_{1-x-z}N_xC_z$, where x and z are atomic concentrations. In some embodiments, x is from 0 to about 0.5, and z is greater than 0 and lower than or equal to about 0.5.

In some embodiments, the thickness T6 of the top WF metal layer 214b is greater than the thickness T5 of the bottom WF metal layer 214a. That is, the top WF metal layer 214b dominates the effective WF of the pair of WF metal layers 214p. In some embodiments, a ratio of the thickness T5 to T6 is in a range of about 0.025 to about 1. If the ratio is greater than 1, then the bottom WF metal layer 214a will dominate the effective WF. If the ratio is less than 0.025, then the resistance of metal gate become large due to less volume in the remaining opening 172 for filling metal deposition.

Figure 4C:
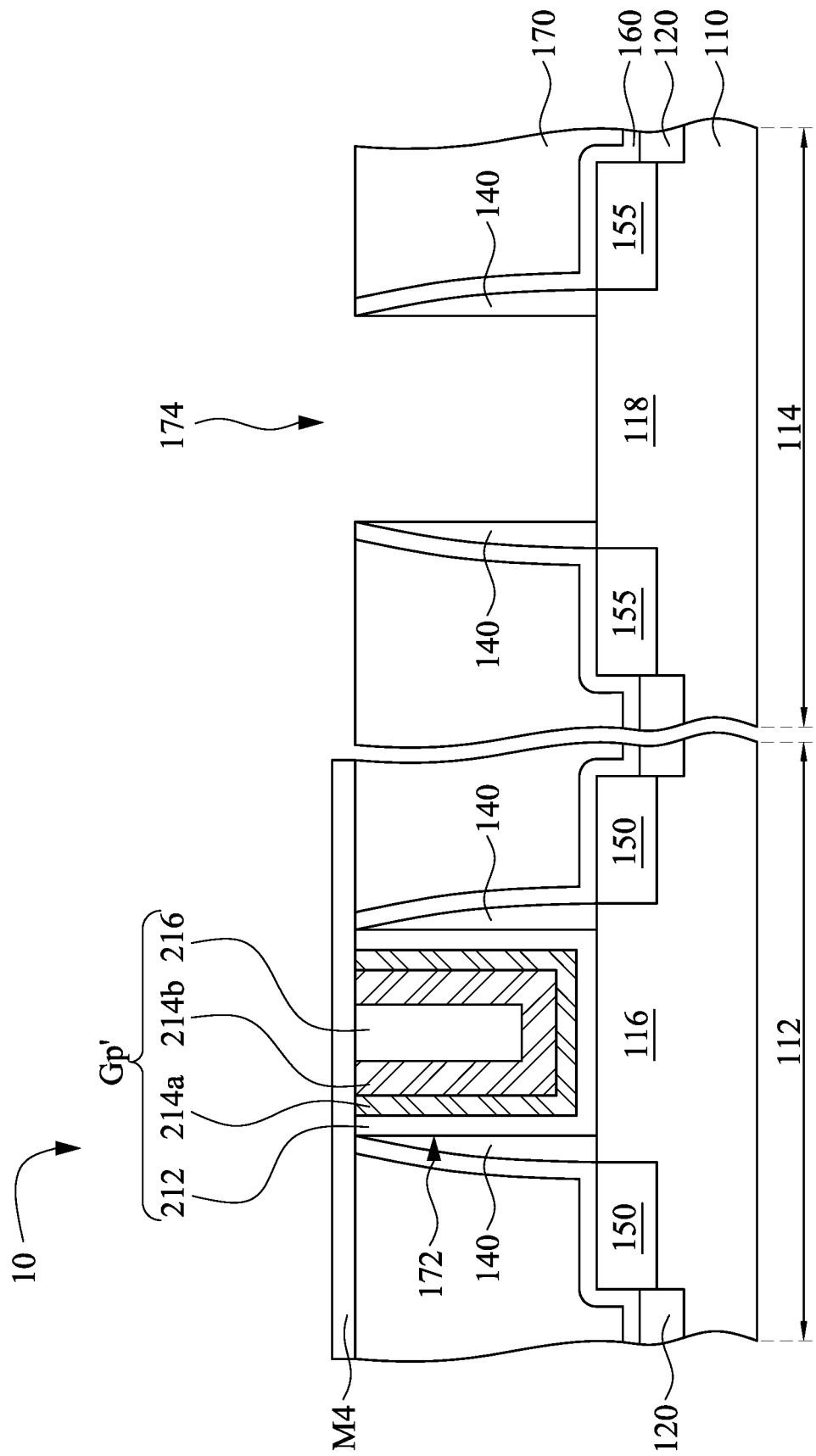

Referring to FIG. 4C, another mask M4 is formed over the P-type region 112 of the substrate 110, and the dummy gate stack 130n is removed to form an opening 174 with the spacer structure 140 as its sidewall.

Figure 4D:
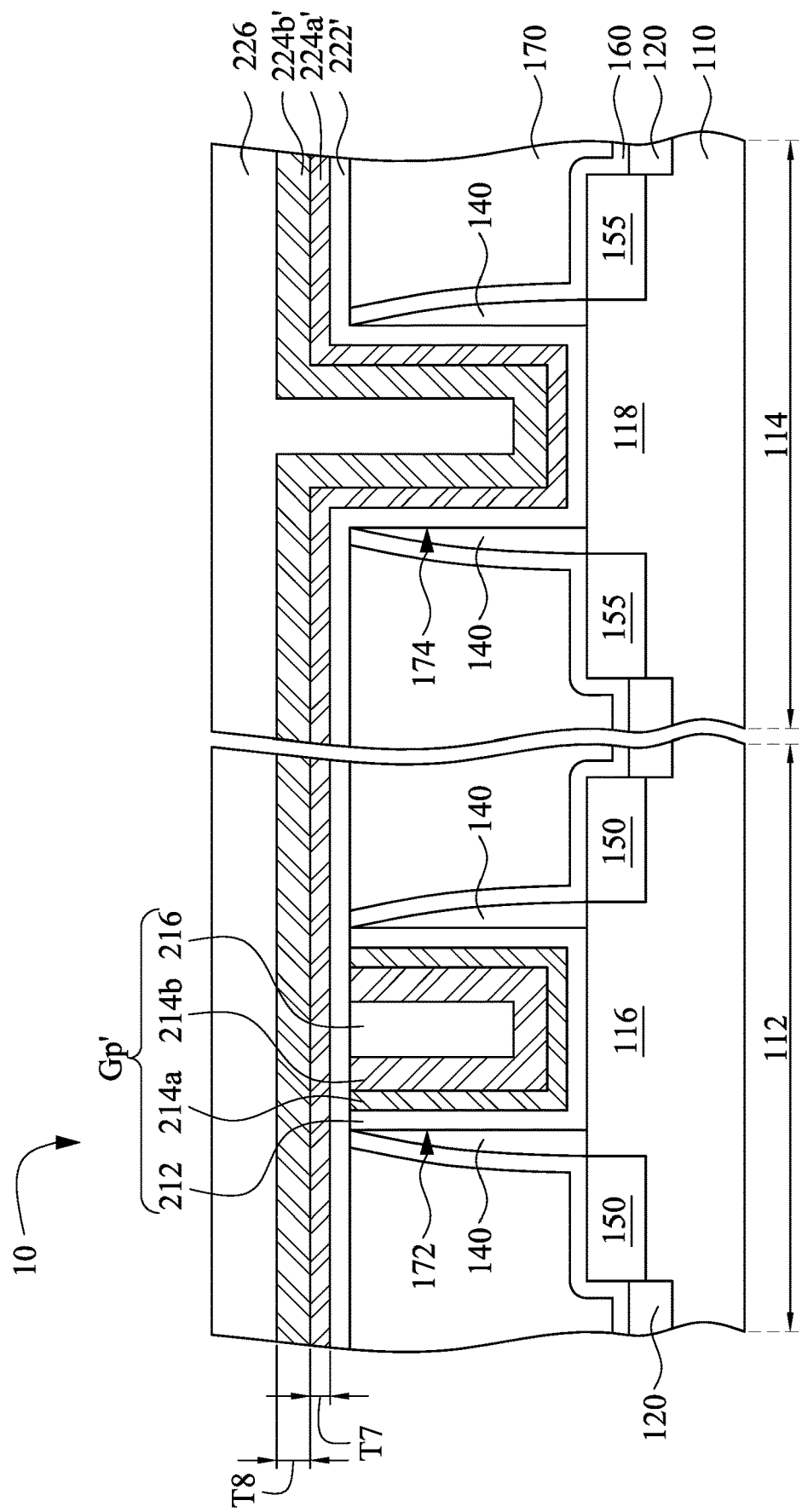

Referring to FIG. 4D, after the opening 174 is formed, the mask M4 of FIG. 4C is removed. Then, a gate dielectric layer 222' is formed in the opening 174. The gate dielectric layer 222' and 182' (see FIG. 2I) may have the same or similar materials and/or manufacturing process, such that the details thereof are not repeated hereinafter. Then, a bottom WF metal layer 224a' is conformally formed over the gate dielectric layer 222'. The bottom WF metal layer 224a' and the top WF metal layer 214b' (see FIG. 4A) may have the same or similar materials and/or manufacturing process, such that the details thereof are not repeated hereinafter. In FIG. 4D, the bottom WF metal layer 224a' has a thickness T7. In some embodiments, the thickness T7 is in a range of about 0.1 nm to about 10 nm.

Then, a top WF metal layer 224b' is conformally formed over the bottom WF metal layer 224a'. The top WF metal layer 224b' and the bottom WF metal layer 214a' (see FIG. 4A) may have the same or similar materials and/or manufacturing process, such that the details thereof are not repeated hereinafter. In FIG. 4D, the top WF metal layer 224b' has a thickness T8. In some embodiments, the thickness T8 is in a range of about 0.1 nm to about 10 nm.

In some embodiments, since the bottom WF metal layer 224a' and the top WF metal layer 224b' include the same elements (e.g., W and N), the bottom WF metal layer 224a' and the top WF metal layer 224b' may be in-situ formed. In some other embodiments, however, the bottom WF metal layer 224a' and the top WF metal layer 224b' may be ex-situ formed.

Then, the remaining opening 174 is filled with a filling metal 226' on the top WF metal layer 224b'. In some embodiments, the filling metal 226' includes the same metal as the top WF metal layer 224b', e.g., W in this case. As such, the filling metal 226' and the top WF metal layer 224b' may be formed by using the same precursors. The filling metal 226' is deposited by ALD, PVD, CVD, or other suitable process.

Figure 4E:
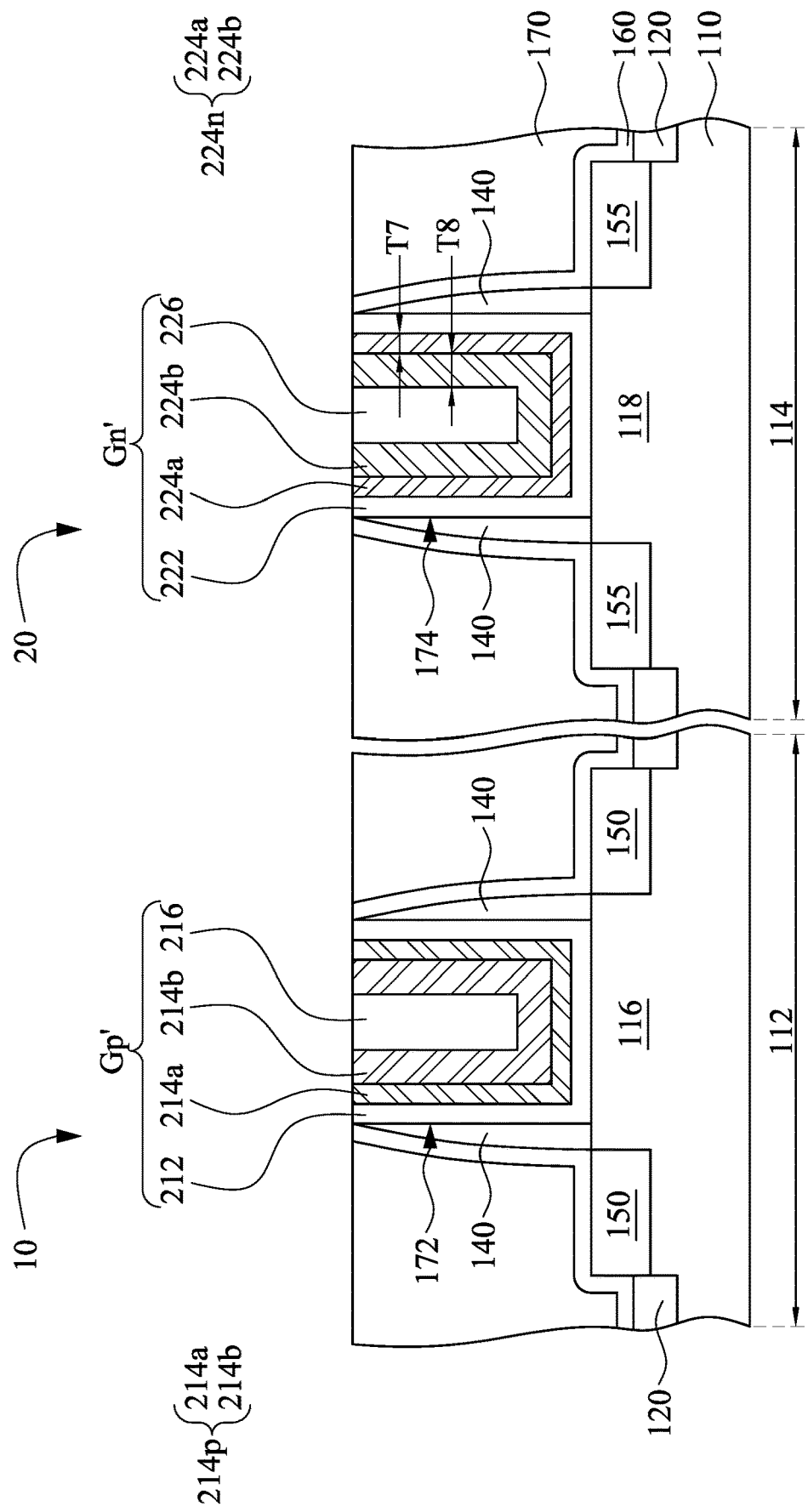

Referring to FIG. 4E, a CMP process is applied to remove excessive the filling metal 226', the top WF metal layer 224b', the bottom WF metal layer 224a', and the gate dielectric layer 222' to provide a substantially planar top surface. The remaining filling metal 226, the remaining top WF metal layer 224b, the remaining bottom WF metal layer 224a, and the remaining gate dielectric layer 222 in the opening 174 form a gate stack Gn' of an N-type device 20. Further, the top WF metal layer 224b and the bottom WF metal layer 224a form a pair of WF metal layers 224n, and the top WF metal layer 224b is in contact with the bottom WF metal layer 224a.

Figure 5B:
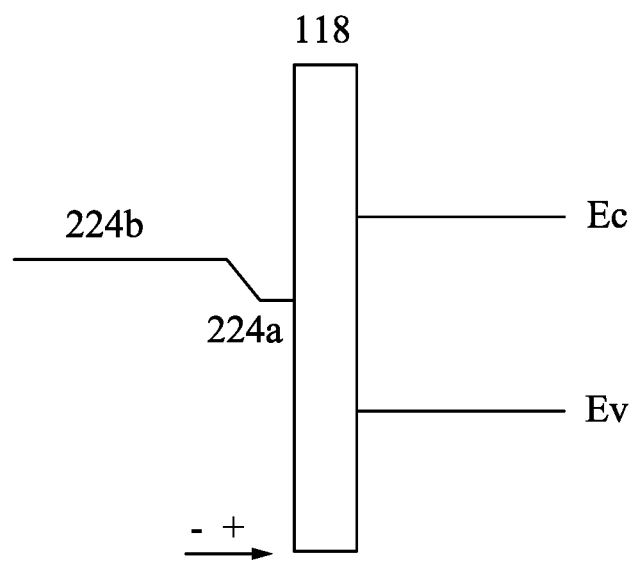
FIG. 5B is a band diagram of the semiconductor fin, the bottom WF metal layer, and the top WF metal layer in FIG. 4E.

FIG. 5B is the band diagram of the semiconductor fin 118, the bottom WF metal layer 224a, and the top WF metal layer 224b in FIG. 4E. Referring to FIGS. 4E and 5B, the bottom WF metal layer 224a and the top WF metal layer 224b have the same material except that the bottom WF metal layer 224a further includes dopants (e.g., carbon in this case). Therefore, the bottom WF metal layer 224a and the top WF metal layer 224b have different group electronegativities. In this case, since the group electronegativity of carbon is about 2.05, and the group electronegativity of nitrogen is about 3.04, the bottom WF metal layer 224a is more electrically positive than the top WF metal layer 224b. Dipoles (shown in FIG. 5B) are thus formed at the interface of the bottom WF metal layer 224a and the top WF metal layer 224b. The dipoles direct from the top WF metal layer 224b to the bottom WF metal layer 224a. These dipoles raise the band of the top WF metal layer 224b, such that the band of the top WF metal layer 224b is close to the conduction band (Ec). With this configuration, the effective WF of the top WF metal layer 224b decreases, and the threshold voltage (Vt) of the metal gate stack Gn' can be tuned accordingly.

The intensity of the dipoles depends on the concentration of the carbon. When the carbon concentration is increased, the band the top WF metal layer 224b is much closer to the conduction band. In some embodiments, the doped top WF metal layer 224b is $W_{1-x-z}N_xC_z$, where x and z are atomic concentrations. In some embodiments, x is from 0 to about 0.5, and z is greater than 0 and lower than or equal to about 0.5.

In some embodiments, the thickness T8 of the top WF metal layer 224b is greater than the thickness T7 of the bottom WF metal layer 224a. That is, the top WF metal layer 224b dominates the effective WF of the pair of WF metal layers 224n. In some embodiments, a ratio of the thickness T7 to T8 is in a range of about 0.025 to about 1. If the ratio is greater than 1, then the bottom WF metal layer 224a will dominate the effective WF. If the ratio is less than 0.025, then the resistance of metal gate become large due to less volume in the remaining opening 174 for filling metal deposition.

In the P-type device 10, the pair of WF metal layers 214p has a thick layer (i.e., the top WF metal layer 214b in this case) and a thin layer (i.e., the bottom WF metal layer 214a in this case). The thin layer has a group electronegativity higher than the thick layer. Further, the metal layer having higher group electronegativity (i.e., the bottom WF metal layer 214a in this case) is between the gate dielectric layer 212 and the metal layer having lower group electronegativity (i.e., the top WF metal layer 214b in this case).

On contrary, in the N-type device 20, the pair of WF metal layers 224n has a thick layer (i.e., the top WF metal layer 224b in this case) and a thin layer (i.e., the bottom WF metal layer 224a in this case). The thin layer has a group electronegativity lower than the thick layer. Further, the metal layer having lower group electronegativity (i.e., the bottom WF metal layer 224a in this case) is between the gate dielectric layer 222 and the metal layer having higher group electronegativity (i.e., the top WF metal layer 224b in this case).

Figure 4F:
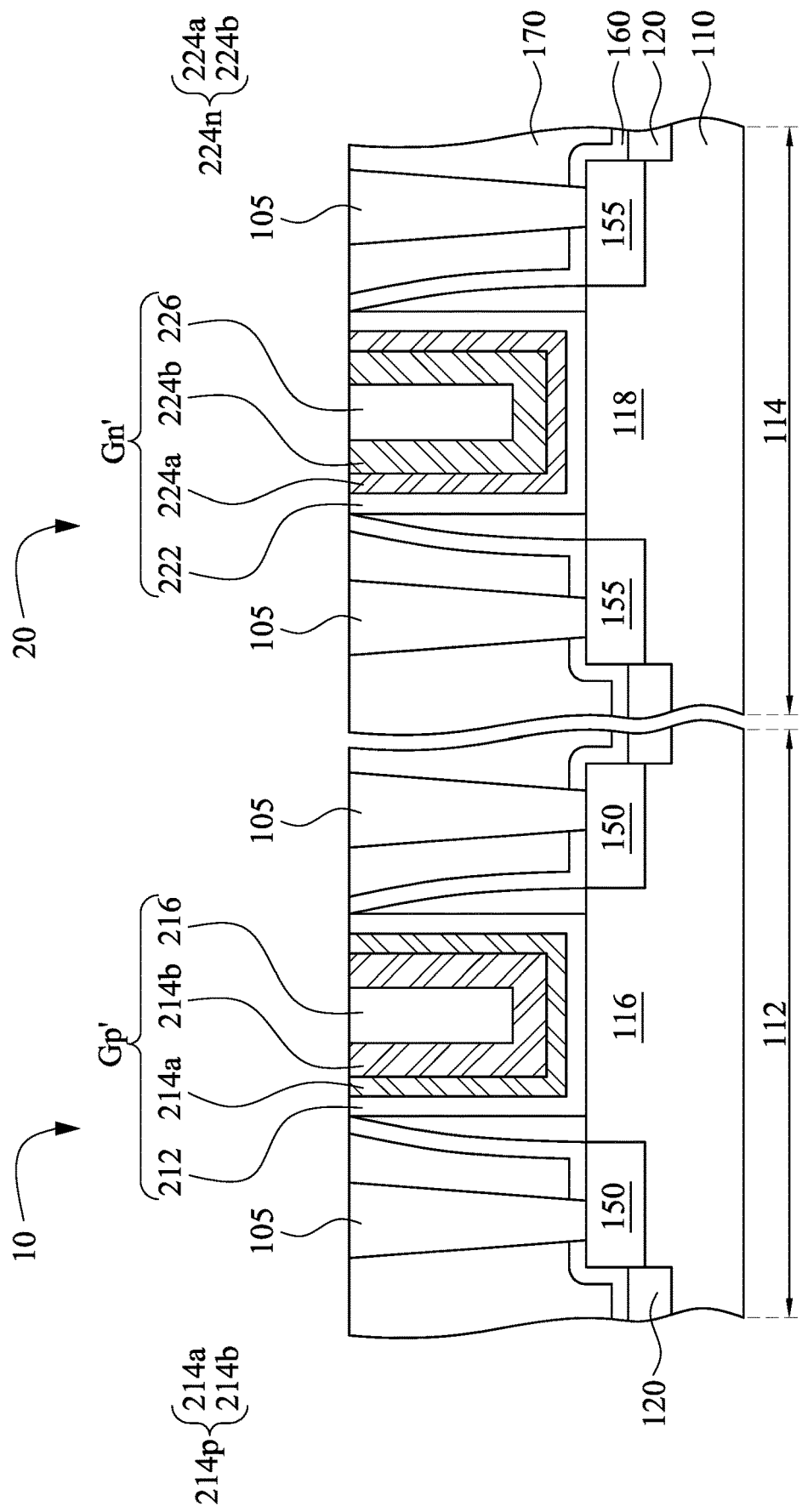

In operation S30 of method M10, a plurality of contacts 105 are formed in the ILD 170, as shown in FIG. 4F. The contacts 105 in FIGS. 4F and 2N may have the same or similar materials and/or manufacturing process, such that the details thereof are not repeated hereinafter.

In some other embodiments, operation S28 of the method M10 in FIG. 1B may be performed in other ways. For example, the metal gate stack Gn' may be formed before the metal gate stack Gp'. That is, the processes in FIGS. 4C-4E may be performed before the processes in FIGS. 2H and 4A-4B.

Figure 6:
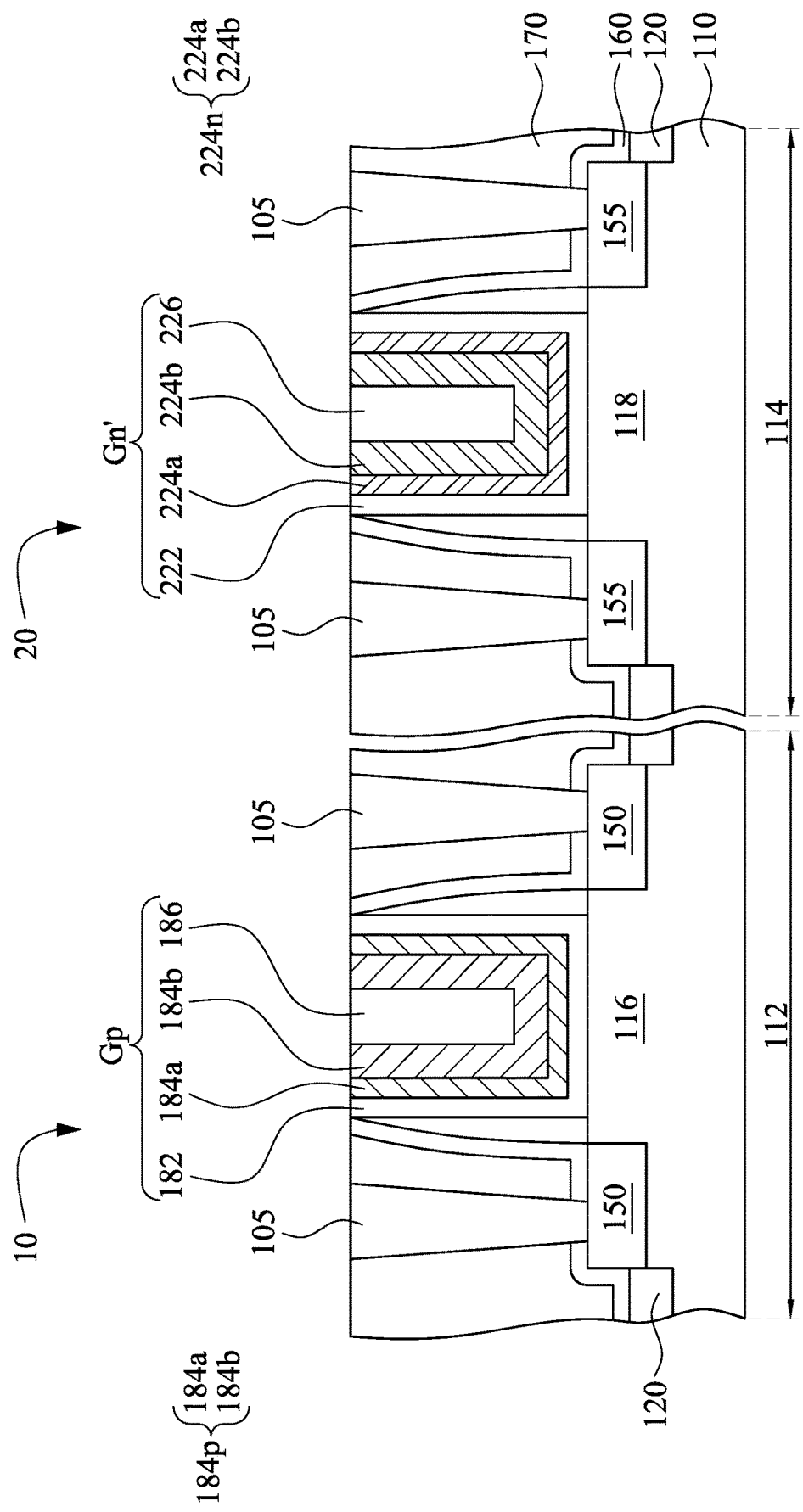
FIGS. 6 and 7 respectively illustrate cross-sectional views of the semiconductor devices in accordance with some embodiments of the present disclosure.
Figure 7:
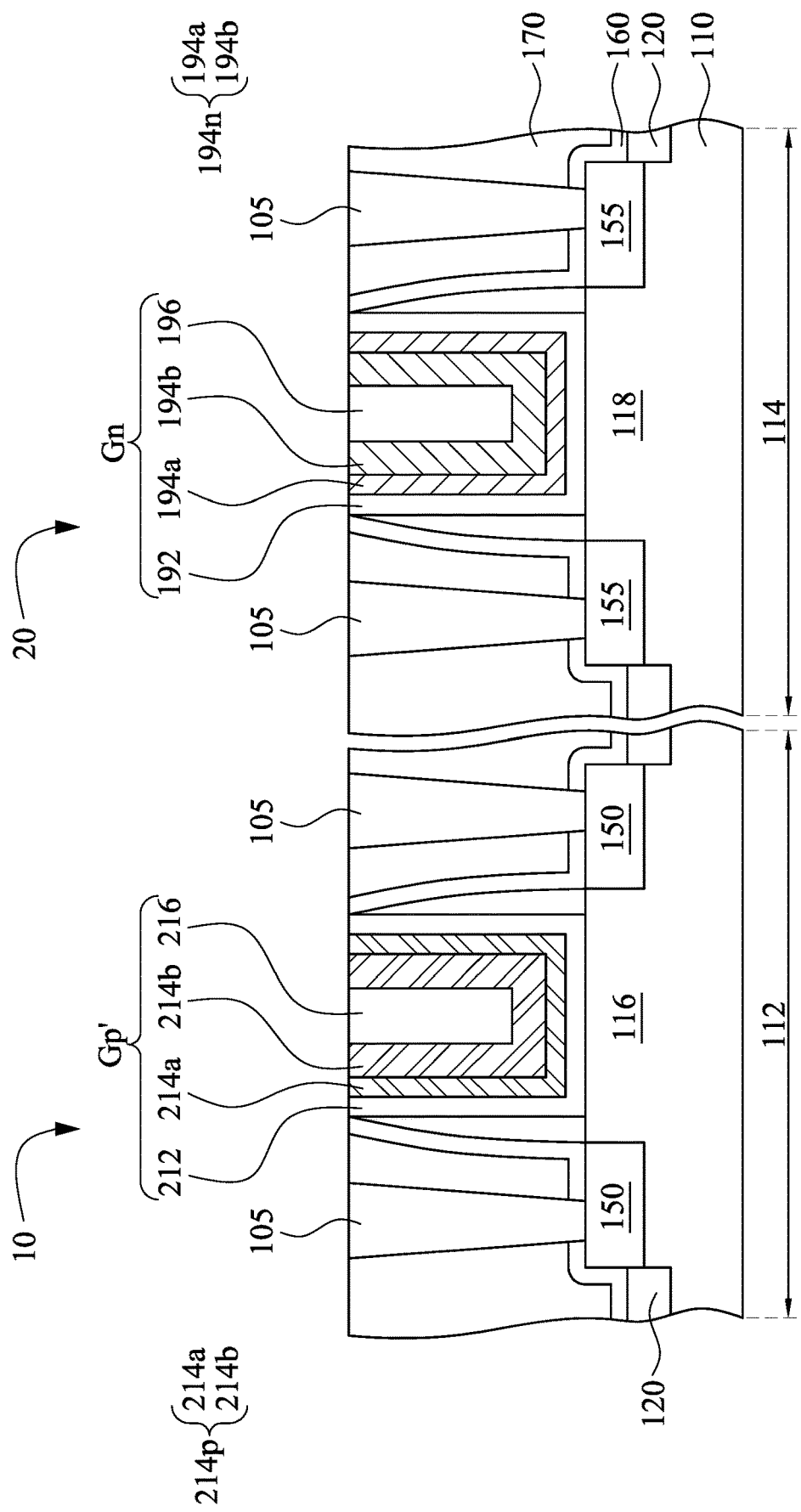

In some other embodiments, the doped WF metal layers in the P-type and N-type devices 10 and 20 may have different dopants. FIGS. 6 and 7 respectively illustrate cross-sectional views of the semiconductor devices in accordance with some embodiments of the present disclosure. In FIG. 6, the P-type device 10 includes a metal gate stack Gp, where the dopants in the pair of WF metal layers of the metal gate stack Gp are oxygen. The N-type device 20 includes a metal gate stack Gn', where the dopants in the pair of WF metal layers of the metal gate stack Gn' are carbon. In FIG. 7, the P-type device 10 includes a metal gate stack Gp', where the dopants in the pair of WF metal layers of the metal gate stack Gp' are carbon. The N-type device 20 includes a metal gate stack Gn, where the dopants in the pair of WF metal layers of the metal gate stack Gn are oxygen.

It is noted that the aforementioned embodiments are illustrative, and should not limit the present disclosure. In some other embodiments, the top and bottom WF metal layers can both include (different or same) dopants. For example, for the P-type device 10, the bottom WF metal layer 184a (214a) is $W_{1-x1-y1-z1}N_{x1}O_{y1}C_{z1}$, and the top WF metal layer 184b (214b) is $W_{1-x2-y2-z2}N_{x2}O_{y2}C_{z2}$. In some embodiments, x1 is from 0 to about 0.5, y1 is greater than or equal to 0 and lower than or equal to about 0.3, z1 is greater than or equal to 0 and lower than or equal to about 0.5, x2 is from 0 to about 0.5, y2 is greater than or equal to 0 and lower than or equal to about 0.3, and z2 is greater than or equal to 0 and lower than or equal to about 0.5. In some embodiments, y2 is less than y1, and z2 is greater than z1. Embodiments fall within the present disclosure as long as the bottom WF metal layer 184a (214a) has a group electronegativity higher than the top WF metal layer 184b (214b). Furthermore, the metal gate stack of the P-type device 10 may include a plurality of WF metal layers (more than two layers), in which a lower WF metal layer has a group electronegativity higher than an upper WF metal layer. Further, the upper WF metal layer is thicker than the lower WF metal layer.

Moreover, for the N-type device 20, the bottom WF metal layer 194a (224a) is $W_{1-x3-y3-z3}N_{x3}O_{y3}C_{z3}$, and the top WF metal layer 194b (224b) is $W_{1-x4-y4-z4}N_{x4}O_{y4}C_{z4}$. In some embodiments, x3 is from 0 to about 0.5, y3 is greater than or equal to 0 and lower than or equal to about 0.3, z3 is greater than or equal to 0 and lower than or equal to about 0.5, x4 is from 0 to about 0.5, y4 is greater than or equal to 0 and lower than or equal to about 0.3, and z4 is greater than or equal to 0 and lower than or equal to about 0.5. In some embodiments, y4 is greater than y3, and z4 is less than z3. Embodiments fall within the present disclosure as long as the bottom WF metal layer 194a (224a) has a group electronegativity lower than the top WF metal layer 194b (224b). Furthermore, the metal gate stack of the N-type device 20 may include a plurality of WF metal layers (more than two layers), in which a lower WF metal layer has a group electronegativity lower than an upper WF metal layer. Further, the upper WF metal layer is thicker than the lower WF metal layer.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the threshold voltage of the metal gate stack can be tuned by adjusting the dopant concentration of the WF metal layer. Another advantage is that the WF metal layers can be in-situ deposited. Furthermore, the threshold voltages of the metal gate stacks of the P-type device and the N-type device can be implemented using the same materials with different dopants.

According to some embodiments, a semiconductor device includes a substrate, a gate stack, and an epitaxy structure. The gate stack over the substrate and includes a gate dielectric layer, a bottom work function (WF) metal layer, a top WF metal layer, and a filling metal. The bottom WF metal layer is over the gate dielectric layer. The top WF metal layer is over and in contact with the bottom WF metal layer. At least one of the top and bottom WF metal layers includes dopants, and the top WF metal layer is thicker than the bottom WF metal layer. The filling metal is over the top WF metal layer. The epitaxy structure is over the substrate and adjacent the gate stack.

According to some embodiments, a semiconductor device includes a P-type device and an N-type device. The P-type device includes a first metal gate including a first bottom WF metal layer and a first top WF metal layer over the first bottom WF metal layer. The first bottom WF metal layer has a group electronegativity higher than a group electronegativity of the first top WF metal layer. The N-type device is adjacent the P-type device and includes a second metal gate including a second bottom WF metal layer and a second top WF metal layer over the second bottom WF metal layer. The second bottom WF metal layer has a group electronegativity lower than a group electronegativity of the second top WF metal layer.

According to some embodiments, a method for manufacturing a semiconductor device includes forming a dummy gate over a substrate. An interlayer dielectric (ILD) is formed over the substrate and surrounds the dummy gate. The dummy gate is removed to form an opening in the ILD. A gate dielectric layer is formed in the opening. A pair of doped work function (WF) metal layer is formed over the gate dielectric layer. The pair of doped WF metal layer includes a bottom WF metal layer and a top WF metal layer. A filling metal is formed over the top WF metal layer. The pair of doped WF metal layer and the filling metal include same metals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate having a P-type region;
   a gate stack over the P-type region of the substrate and comprising:
      a gate dielectric layer;
      a bottom work function (WF) metal layer over the gate dielectric layer;
      a top WF metal layer over and in contact with the bottom WF metal layer,
   wherein dipoles are formed between the top WF metal layer and the bottom WF metal layer, and the dipoles direct from the bottom WF metal layer to the top WF metal layer; and
      a filling metal over the top WF metal layer; and
   epitaxy structures over the P-type region of the substrate and on opposite sides of the gate stack.

2. The semiconductor device of claim 1, wherein the bottom WF metal layer and the filling metal comprise same metals.

3. The semiconductor device of claim 1, wherein the top and bottom WF metal layers comprise same metals.

4. The semiconductor device of claim 1, wherein the bottom WF metal layer has a group electronegativity higher than that of a group electronegativity of the top WF metal layer.

5. The semiconductor device of claim 4, wherein the bottom WF metal layer comprises dopants, and the dopants are oxygen.

6. The semiconductor device of claim 4, wherein the top WF metal layer comprises dopants, and the dopants are carbon.

7. The semiconductor device of claim 1, wherein the top and bottom WF metal layers both comprise tungsten.

8. A semiconductor device comprising:
   a P-type device comprising:
      a first metal gate comprising a first bottom work function (WF) metal layer and a first top WF metal layer over the first bottom WF metal layer, wherein the first bottom WF metal layer has a group electronegativity higher than a group electronegativity of the first top WF metal layer; and
   an N-type device adjacent the P-type device and comprising:
      a second metal gate comprising a second bottom WF metal layer and a second top WF metal layer over the second bottom WF metal layer, wherein the second bottom WF metal layer has a group electronegativity lower than a group electronegativity of the second top WF metal layer.

9. The semiconductor device of claim 8, wherein the first bottom WF metal layer and the second top WF metal layer comprise same metals.

10. The semiconductor device of claim 8, wherein the first top WF metal layer and the second bottom WF metal layer comprise same dopants.

11. The semiconductor device of claim 8, wherein the first top WF metal layer and the second top WF metal layer comprise different dopants.

12. The semiconductor device of claim 8, wherein the first bottom WF metal layer is in contact with the first top WF metal layer.

13. The semiconductor device of claim 8, wherein the second bottom WF metal layer is in contact with the second top WF metal layer.

14. The semiconductor device of claim 8, wherein a thickness of the first top WF metal layer is greater than a thickness of the first bottom WF metal layer, and a thickness of the second top WF metal layer is greater than a thickness of the second bottom WF metal layer.

15. A semiconductor device comprising:
- a substrate having an N-type region and a P-type region;
- an N-type transistor over the N-type region of the substrate and comprising:
  - a first gate dielectric layer over the substrate;
  - a first bottom work function (WF) metal layer over the first gate dielectric layer; and
  - a first top WF metal layer over and in contact with the first bottom WF metal layer; and
- a P-type transistor over the P-type region of the substrate and comprising:
  - a second gate dielectric layer over the substrate;
  - a second bottom WF metal layer over the second gate dielectric layer; and
  - a second top WF metal layer over and in contact with the first bottom WF metal layer, wherein the first bottom WF metal layer and the second top WF metal layer comprise same materials, and the second bottom WF metal layer and the first top WF metal layer comprise same materials.

16. The semiconductor device of claim 15, wherein dipoles are formed between the first top WF metal layer and the first bottom WF metal layer, and the dipoles direct from the first top WF metal layer to the first bottom WF metal layer.

17. The semiconductor device of claim 15, wherein dipoles are formed between the second top WF metal layer and the second bottom WF metal layer, and the dipoles direct from the second bottom WF metal layer to the second top WF metal layer.

18. The semiconductor device of claim 15, wherein both the first top WF metal layer and the second bottom WF metal layer are doped with oxygen.

19. The semiconductor device of claim 15, wherein both the first bottom WF metal layer and the second top WF metal layer are doped with carbon.

20. The semiconductor device of claim 15, wherein both the second bottom WF metal layer and the second top WF metal layer comprise nitride.

* * * * *